(12) United States Patent
Jang et al.

(10) Patent No.: US 10,547,478 B2
(45) Date of Patent: Jan. 28, 2020

(54) METHOD FOR SIGNAL MODULATION BASED ON PULSE DENSITY MODULATION AND APPARATUS THEREFOR

(71) Applicant: Electronics and Telecommunications Research Institute, Daejeon (KR)

(72) Inventors: Seung Hyun Jang, Daejeon (KR); Sun Woo Kong, Daejeon (KR); Kwang Seon Kim, Sejong-si (KR); Myung Don Kim, Daejeon (KR); Hui Dong Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/226,812

(22) Filed: Dec. 20, 2018

(65) Prior Publication Data
US 2019/0207790 A1    Jul. 4, 2019

(30) Foreign Application Priority Data
Dec. 28, 2017  (KR) .................. 10-2017-0182405

(51) Int. Cl.
*H04L 25/49* (2006.01)
*H04B 10/508* (2013.01)
*H03M 3/00* (2006.01)

(52) U.S. Cl.
CPC .......... *H04L 25/4902* (2013.01); *H03M 3/43* (2013.01); *H04B 10/508* (2013.01)

(58) Field of Classification Search
CPC .......... H04L 25/4902; H03F 2200/331; H03F 3/2175; H03M 3/368; H03M 3/50
See application file for complete search history.

(56) References Cited

U.S. PATENT DOCUMENTS

| 5,287,107 A * | 2/1994 | Gampell ............... | H03M 3/368 341/110 |
|---|---|---|---|
| 6,683,905 B1 | 1/2004 | King et al. | |
| 7,474,858 B2 | 1/2009 | Lee et al. | |
| 9,509,331 B1 | 11/2016 | Pagnanelli | |
| 2002/0097085 A1* | 7/2002 | Stapleton .............. | H03F 3/2171 330/10 |

(Continued)

FOREIGN PATENT DOCUMENTS

| KR | 10-2005-0084176 A | 8/2005 |
|---|---|---|
| KR | 10-1575036 B1 | 12/2015 |

*Primary Examiner* — David S Huang
(74) *Attorney, Agent, or Firm* — NSIP Law

(57) ABSTRACT

Disclosed are a method for signal modulation based on pulse density modulation and an apparatus therefore. The method for signal modulation is performed in an apparatus for modulating a signal based on pulse density modulation and includes performing pulse density modulation on an analog signal input to the apparatus through a pulse density modulator of the apparatus, converting a bandwidth of the pulse density modulated signal into a bandwidth required for the apparatus through a correlative encoder of the apparatus, transmitting the bandwidth converted signal to a radio frequency (RF) unit of the apparatus based on an electrical-to-optical (E/O) converter and an optical-to-electrical (O/E) converter of the apparatus, filtering a frequency band of the bandwidth converted signal and outputting the frequency band filtered signal via the RF unit.

18 Claims, 20 Drawing Sheets

(56) References Cited

U.S. PATENT DOCUMENTS

| | | |
|---|---|---|
| 2004/0130471 A1 | 7/2004 | Lee |
| 2005/0134398 A1 | 6/2005 | Myong et al. |
| 2007/0090979 A1 | 4/2007 | Lin |
| 2014/0064355 A1 | 3/2014 | Cho et al. |
| 2016/0094294 A1 | 3/2016 | Jang et al. |
| 2017/0187515 A1 | 6/2017 | Darwhekar et al. |

* cited by examiner

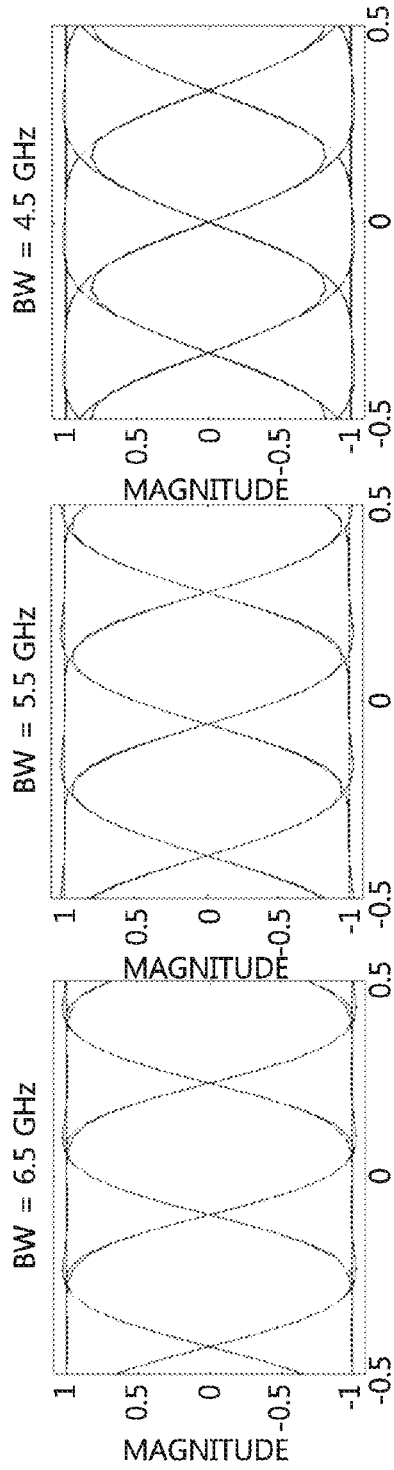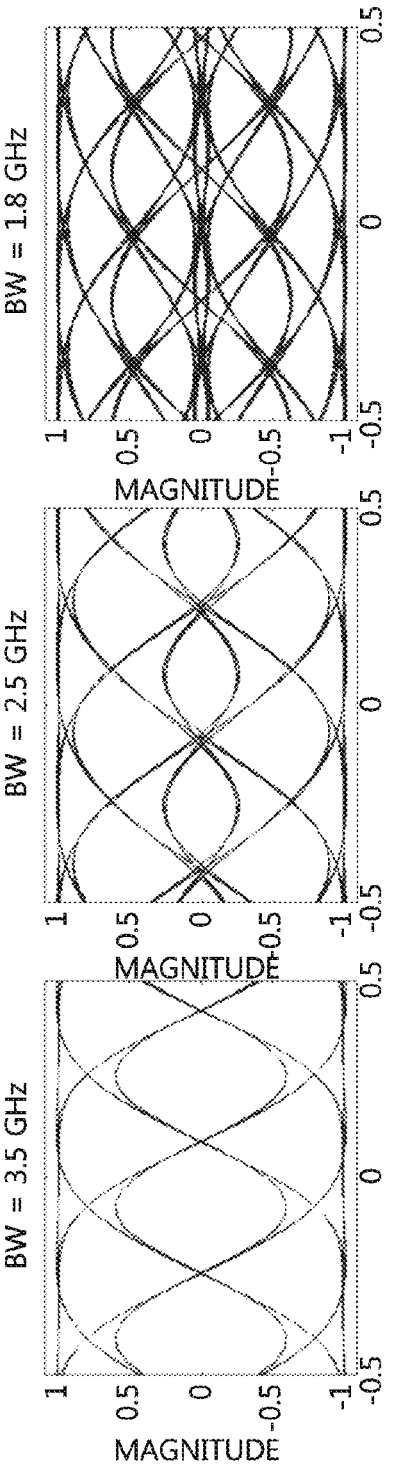

METHOD FOR SIGNAL MODULATION BASED ON PULSE DENSITY MODULATION AND APPARATUS THEREFOR

CROSS-REFERENCE TO RELATED APPLICATIONS

This application claims priority to Korean Patent Application No. 10-2017-0182405 filed on Dec. 28, 2017 in the Korean Intellectual Property Office (KIPO), the entire contents of which are hereby incorporated by reference.

BACKGROUND

1. Technical Field

Example embodiments of the present invention relate to a method for signal modulation based on pulse density modulation and an apparatus therefore, and more specifically, to a method for signal modulation based on pulse density modulation and an apparatus therefore so as to improve a bandwidth through which a signal is transmitted and quality of the transmitted signal.

2. Related Art

Recently, as traffic for wired data and wireless data is increased, a high transmission capacity is required in a transmission system for transmitting signals. In this regard, structures of various transmission systems have been studied in order to satisfy requirements for the high transmission capacity in the signal transmission system. For example, in a long-term evolution (LTE)-based communication network, there has been proposed a method in which a signal (20 MHz) for 48 channels transmitted through a mobile fronthaul section is shifted into a signal having different intermediate frequencies (IFs) and is modulated into an analog signal having a bandwidth of 960 MHz, and the analog signal is transmitted through an analog-based optical transmission and reception system (analog radio over fiber (RoF)).

However, the analog-based optical transmission and reception system has disadvantages including degradation in signal quality due to the nonlinearity of components and signal attenuation according to transmission distance. In order to overcome the disadvantages, research relating to a digital-based signal transmission structure has been carried out recently. For example, an analog signal is modulated by a pulse density modulator based on pulse density, is converted into a digital signal, and then is used as a signal for driving an electrical-to-optical (E/O) converter. Further, the optical signal converted through the E/O converter is converted into an electrical signal through an optical-to-electrical (O/E) converter. Then, the electrical signal may be output via a radio frequency (RF) unit.

However, in the digital-based signal transmission structure, since a sampling frequency of the output signal of the pulse density modulator is greater than a bandwidth of the analog signal being input, there is a disadvantage in that an E/O converter and an O/E converter are additionally required. Further, in the digital-based signal transmission structure, owing to a limitation to a transmission rate available in the E/O converter and O/E converter, there is a disadvantage in that the use of the sampling frequency of the pulse density modulator and the bandwidth of the analog signal being input for modulation are limited.

In order to overcome the above-described disadvantages of the digital-based signal transmission structure, a method of applying a pulse density modulator in which a signal output therefrom has multiple levels has been proposed recently. When the pulse density modulator in which a signal output therefrom has multiple levels is applied to a digital-based signal transmission structure, quantization noise included in the output signal of the pulse density modulator is reduced as the number of output levels used in the pulse density modulator increases so that signal quality can be improved.

However, since the digital-based signal transmission structure to which the pulse density modulator, in which a signal output therefrom has multiple levels, is applied requires a relatively high-speed signal processing, there is a problem in that the number of levels of a signal, which can be processed by the E/O converter and the O/E converter as well as the pulse density modulator, is limited and thus an increase of a bandwidth and improvement of a signal quality are limited at a certain level.

SUMMARY

Accordingly, example embodiments of the present invention are provided to substantially obviate one or more problems due to limitations and disadvantages of the related art.

Example embodiments of the present invention provide a method for signal modulation based on pulse density modulation and an apparatus therefore so as to improve a bandwidth through which a signal is transmitted and quality of the transmitted signal.

In some example embodiments, a method for signal modulation based on pulse density modulation, which is performed in an apparatus for modulating a signal, includes performing pulse density modulation on an analog signal input to the apparatus through a pulse density modulator of the apparatus, converting a bandwidth of the pulse density modulated signal into a bandwidth required for the apparatus through a correlative encoder of the apparatus, transmitting the bandwidth converted signal to a radio frequency (RF) unit of the apparatus based on an electrical-to-optical (E/O) converter and an optical-to-electrical (O/E) converter of the apparatus, and filtering a frequency band of the bandwidth converted signal and outputting the frequency band filtered signal via the RF unit.

The performing of the pulse density modulation may be performed based on a delta-sigma modulation method in the pulse density modulator.

The performing of the pulse density modulation may be performed on the analog signal based on a sampling frequency that is greater than a frequency bandwidth transmittable in the apparatus.

The pulse density modulated signal may be a digital signal including information on a plurality of bits.

The converting of the bandwidth of the pulse density modulated signal into the bandwidth required for the apparatus may include reducing the bandwidth of the pulse density modulated signal to a bandwidth transmittable in the E/O converter and the O/E converter.

The converting of the bandwidth of the pulse density modulated signal into the bandwidth required for the apparatus may be performed based on a delay and add method in the correlative encoder.

The converting of the bandwidth of the pulse density modulated signal into the bandwidth required for the apparatus may be performed based on an input symbol, which is input to the correlative encoder, and a predetermined number of symbols among a plurality of symbols which are input prior to the input symbol.

The outputting of the frequency band filtered signal may include filtering the frequency band of the bandwidth converted signal through a filter included in the RF unit, shifting a frequency band of the frequency band filtered signal through a frequency converter and a local oscillator included in the RF unit, amplifying electric power of the frequency band shifted signal through a power amplifier included in the RF unit, and outputting the electric power amplified signal through an antenna of the RF unit.

In other example embodiments, a method for signal modulation based on pulse density modulation, which is performed in an apparatus for modulating a signal, includes performing pulse density modulation on a plurality of analog signals input to the apparatus through a plurality of pulse density modulators included in the apparatus, converting bandwidths of the plurality of pulse density modulated signals into bandwidths required for the apparatus through a correlative encoder of the apparatus, transmitting the plurality of bandwidth converted signals to a correlative decoder of the apparatus based on an electrical-to-optical (E/O) converter and an optical-to-electrical (O/E) converter of the apparatus, performing correlative decoding on the plurality of bandwidth converted signals through the correlative decoder, and filtering a frequency band of one among the plurality of decoded signals and outputting the frequency band filtered signal via a radio frequency (RF) unit.

The performing of the pulse density modulation may be performed based on a delta-sigma modulation method in the plurality of pulse density modulators.

The performing of the pulse density modulation may be performed on the plurality of analog signals based on a sampling frequency that is greater than a frequency bandwidth transmittable in the apparatus.

The plurality of pulse density modulated signals may be digital signals including information on a plurality of bits.

The converting of the bandwidths of the plurality of pulse density modulated signals into the bandwidths required for the apparatus may include reducing the bandwidths of the plurality of pulse density modulated signals to bandwidths transmittable in the E/O converter and the O/E converter.

The converting of the bandwidth of the pulse density modulated signal into the bandwidth required for the apparatus may be performed based on a delay and add method in the correlative encoder.

The converting of the bandwidth of the pulse density modulated signal into the bandwidth required for the apparatus may be performed based on an input symbol, which is input to the correlative encoder, and a predetermined number of symbols among a plurality of symbols which are input prior to the input symbol.

The converting of the bandwidths of the plurality of pulse density modulated signals into the bandwidths required for the apparatus may include performing multiplexing on the plurality of pulse density modulated signals through a multiplexer of the apparatus and converting the bandwidths of the plurality of multiplexed signals into bandwidths required for the apparatus.

The outputting of the frequency band filtered signal may include performing demultiplexing on the plurality of decoded signals through a demultiplexer of the apparatus and filtering a frequency band of one among the plurality of demultiplexed signals and outputting the frequency band filtered signal.

The outputting of the frequency band filtered signal may include filtering the frequency band of one among the plurality of demultiplexed signals through a filter included in the RF unit, shifting the frequency band of the frequency band filtered signal through a frequency converter and a local oscillator included in the RF unit, amplifying electric power of the frequency band shifted signal through a power amplifier included in the RF unit, and outputting the electric power amplified signal through an antenna of the RF unit.

BRIEF DESCRIPTION OF DRAWINGS

Example embodiments of the present invention will become more apparent by describing in detail example embodiments of the present invention with reference to the accompanying drawings, in which:

FIGS. 10A to 10F are graphs showing an output signal through a filter of the correlative encoder according to one embodiment of the present invention;

DETAILED DESCRIPTION

Figure 1:
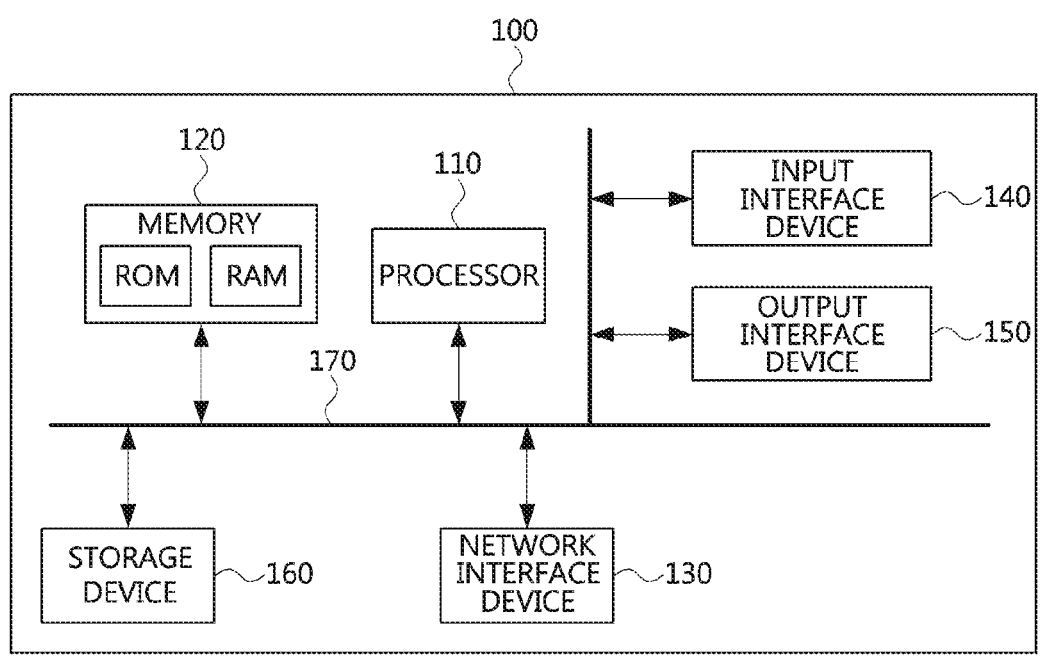
FIG. 1 is a block diagram illustrating a signal modulator for modulating a signal based on pulse density modulation according to one embodiment of the present invention.

The present invention may be modified into various forms and may have a variety of embodiments, and therefore, specific embodiments will be illustrated in the drawings and described in detail. The embodiments, however, are not to be taken in a sense which limits the present invention to the specific embodiments and should be construed to include modifications, equivalents, or substitutes within the spirit and technical scope of the present invention.

Although the terms "first," "second," and the like may be used herein to describe various components, these components should not be limited to these terms. The terms are used only for the purpose of distinguishing one component from another component. For example, without departing from the scope of the present disclosure, a first component may be referred to as a second component, and similarly, a second component may also be referred to as a first component. The term "and/or" includes a combination of a plurality of related described items or any one thereof When a component is referred to as being "connected" or "coupled" to another component, it may be directly connected or coupled to another component, but it should be understood that yet another component may exist between the component and another component. Meanwhile, when a component is referred to as being "directly connected" or "directly coupled" to another component, it should be understood that yet another component may be absent between the component and another component.

The terms used herein are employed to describe only specific embodiments and are not intended to limit the present invention. Unless the context clearly dictates otherwise, the singular form includes the plural form. It should be understood that the terms "comprise," "include," and "have" specify the presence of stated herein features, numbers, steps, operations, components, elements, or combinations thereof, but do not preclude the presence or possibility of adding one or more other features, numbers, steps, operations, components, elements, or combinations thereof.

Unless otherwise defined, all terms including technical or scientific terms used herein have the same meaning as commonly understood by those skilled in the art to which the present invention pertains. General terms that are defined in a dictionary shall be construed as having meanings that are consistent with the context of the relevant art and are not to be interpreted with idealistic or excessively formalistic meanings unless clearly defined in the present application.

Hereinafter, preferred embodiments of the present disclosure will be described in detail with reference to the accompanying drawings. In order to facilitate a thorough understanding of the present invention, the same reference numerals are used for the same constituent elements in the drawings, and an overlapping description for the same components will be omitted.

FIG. 1 is a block diagram illustrating a signal modulator for modulating a signal based on pulse density modulation according to one embodiment of the present invention.

Referring to FIG. 1, a signal modulator 100 may include at least one processor 110, a memory 120, and a network interface device 130 connected to a network and configured to perform communication. Further, the signal modulator 100 may further include an input interface device 140, an output interface device 150, a storage device 160, and the like. The components included in the signal modulator 100 may be connected by a bus 170 to communicate with one another.

The processor 110 may execute a program command stored in at least one of the memory 120 and the storage device 160. The processor 110 may mean a central processing unit (CPU), a graphics processing unit (GPU), or a dedicated processor in which methods according to embodiments of the present invention are performed. Each of the memory 120 and the storage device 160 may be configured with at least one of a volatile storage medium and a nonvolatile storage medium. For example, the memory 120 may be configured with at least one of a read-only memory (ROM) and a random access memory (RAM).

Figure 2:
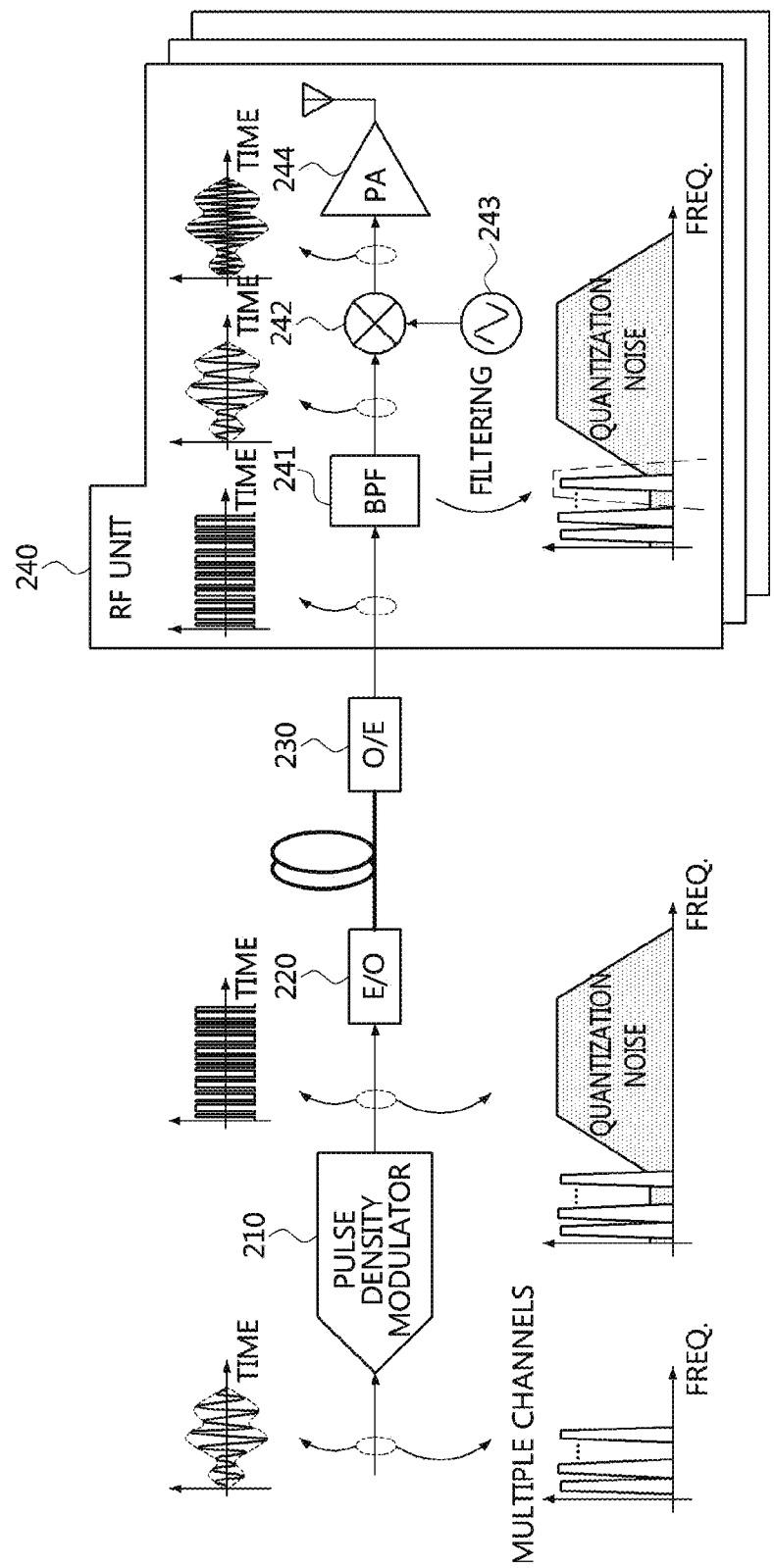
FIG. 2 is a conceptual diagram illustrating a first example of a method of modulating a signal based on pulse density modulation.
Figure 3:
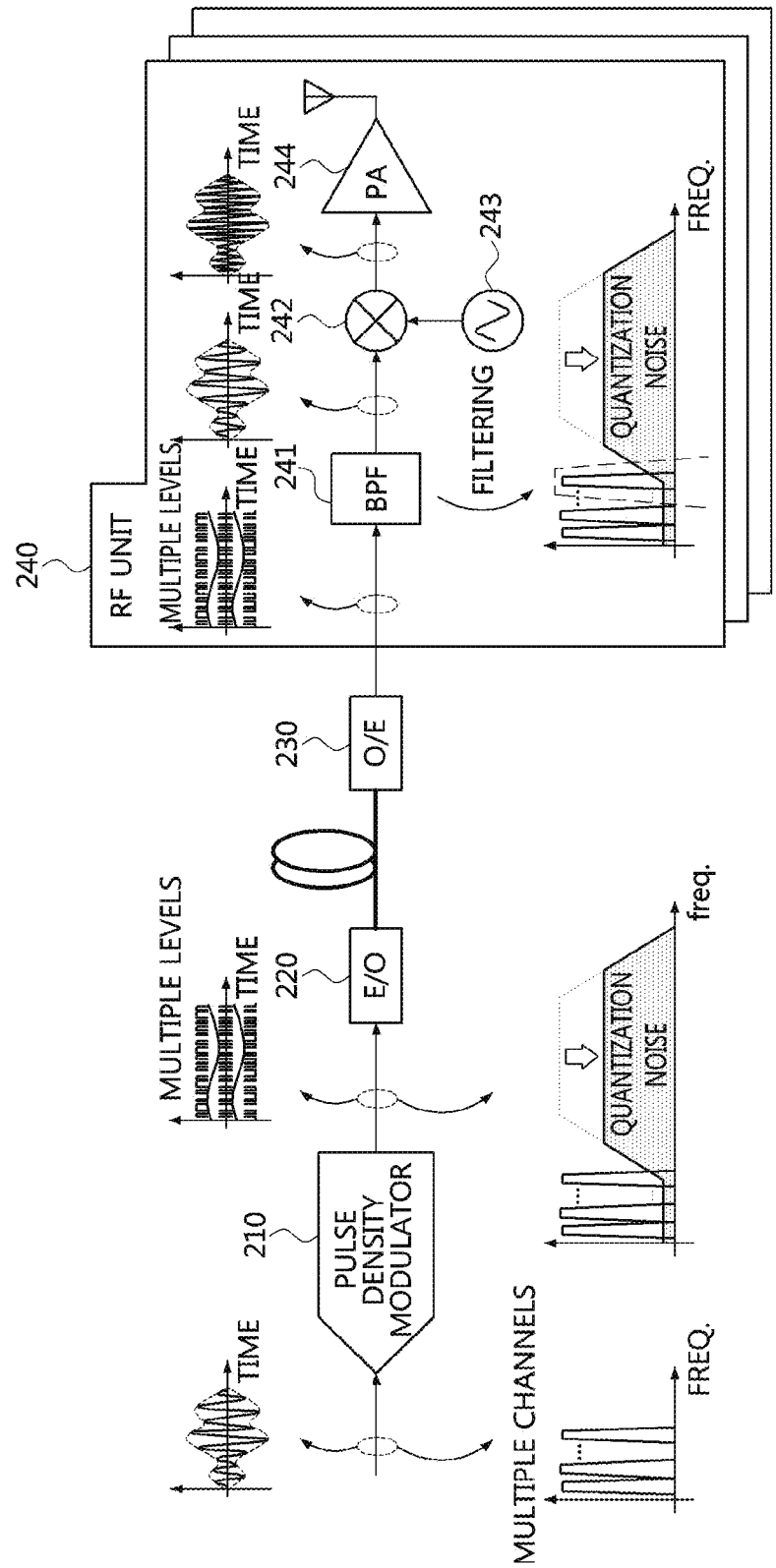
FIG. 3 is a conceptual diagram illustrating a second example of a method of modulating a signal based on pulse density modulation.

FIG. 2 is a conceptual diagram illustrating a first example of a method of modulating a signal based on pulse density modulation, and FIG. 3 is a conceptual diagram illustrating a second example of a method of modulating a signal based on pulse density modulation.

Referring to FIG. 2, first, the method of modulating a signal based on pulse density modulation may be performed in a signal modulation device which modulates a signal based on pulse density modulation. The signal modulator may have a structure similar to or the same as a structure of the signal modulator 100 described with reference to FIG. 1. That is, the method of modulating a signal based on pulse density modulation may be performed based on a program command executed by the processor 110 of the signal modulator 100 described with reference to FIG. 1.

However, a plurality of configurations for the method of modulating a signal based on pulse density modulation shown in FIG. 2 may mean a plurality of configurations included in the signal modulator or a signal modulation system for modulating a signal. Specifically, the plurality of configurations for the method of modulating a signal based on pulse density modulation shown in FIG. 2 may be physical configurations, but the present invention is not necessarily limited thereto. In other words, the plurality of configurations for the method of modulating a signal based on pulse density modulation shown in FIG. 2 may be logical configurations separated according to an operation performed in the signal modulator or the signal modulation system.

Specifically, a signal modulator may include a pulse density modulator 210, an electrical-to-optical (E/O) converter 220, an optical-to-electrical (O/E) converter 230, and a radio frequency (RF) unit 240. First, an analog signal input to the signal modulator may be converted into a pulse density modulated digital signal by the pulse density modulator 210. In this case, the pulse density modulated digital signal may be used as a signal for driving the E/O converter 220. Then, the E/O converter 220 may convert the pulse density modulated digital signal into an optical signal and transmit the converted optical signal to the O/E converter 230. The O/E converter 230 may then convert the optical signal into an electrical signal and transmit the converted electrical signal to the RF unit 240.

Here, the RF unit 240 of the signal modulator may include a band pass filter (BPF) 241, a frequency converter 242, a local oscillator 243, and a power amplifier 244. The RF unit 240 may filter a frequency band of the electrical signal input from the (O/E) converter 230 through the BPF 241. Thereafter, the RF unit 240 may shift the filtered frequency band of the electrical signal through the frequency converter 242 and the local oscillator 243. The RF unit 240 may then amplify electric power of the electrical signal having the shifted frequency band through the power amplifier 244 and output the electrical signal having the amplified electric power via an antenna of the RF unit 240.

Meanwhile, referring to FIG. 3, a signal modulator for modulating a signal based on pulse density modulation may be the same as the signal modulator described with reference to FIG. 2. That is, the signal modulator shown in FIG. 3 may include the pulse density modulator 210, the (E/O) converter 220, the (O/E) converter 230, and the RF unit 240, which are a plurality of components included in the signal modulator of FIG. 2. Further, the RF unit 240 may include the BPF 241, the frequency converter 242, the local oscillator 243, and the power amplifier 244.

However, the signal modulator shown in FIG. 3 may apply the pulse density modulator 210 to output a digital signal having multiple levels. That is, a signal output from the pulse density modulator 210 included in the signal modulator of FIG. 3 may be a digital signal having multiple levels. As described above, as the number of levels of the signal output from the pulse density modulator 210 increases, quantization noise included in the signal output from the pulse density modulator 210 may decrease.

Further, as described with reference to FIG. 2, the digital signal having the multiple levels output from the pulse density modulator 210 may be transmitted to the RF unit 240 through the E/O converter 220 and the O/E converter 230. Then, the digital signal having multiple levels, of which a frequency band is filtered by the BPF 241 of the RF unit 240, has quantization noise less than that of the signal of which the frequency band is filtered by the BPF 241 of FIG. 2.

Figure 4:
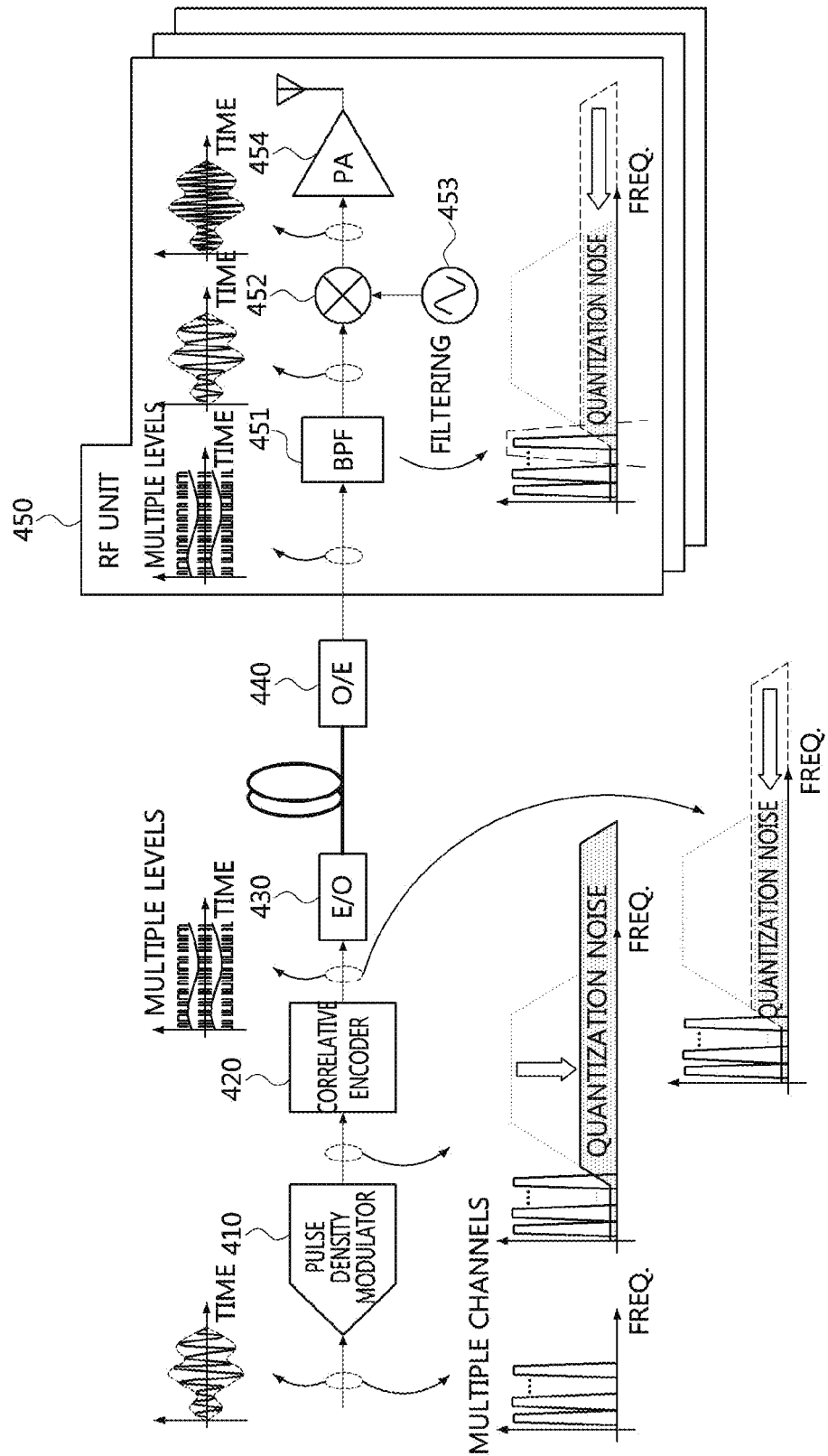
FIG. 4 is a conceptual diagram illustrating a method of modulating a signal based on pulse density modulation according to one embodiment of the present invention.
Figure 5:
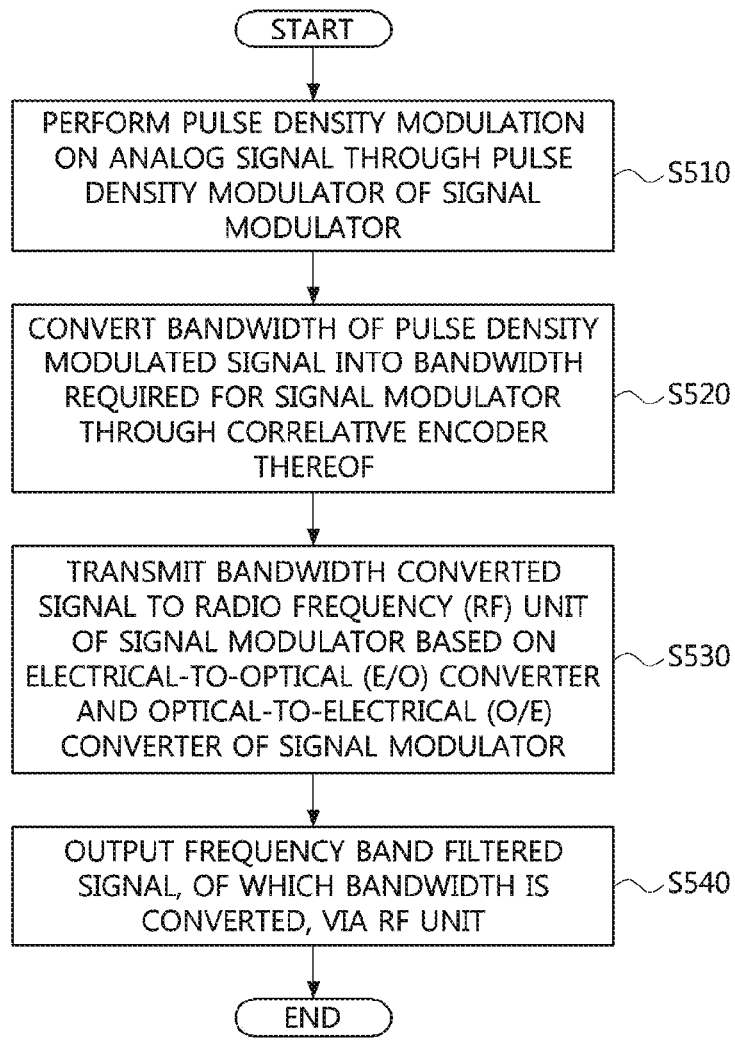
FIG. 5 is a flowchart illustrating the method of modulating a signal based on pulse density modulation according to one embodiment of the present invention.

FIG. 4 is a conceptual diagram illustrating a method of modulating a signal based on pulse density modulation according to one embodiment of the present invention, and FIG. 5 is a flowchart illustrating the method of modulating a signal based on pulse density modulation according to one embodiment of the present invention.

Referring to FIG. 4, first, a signal modulator for performing the method of modulating a signal based on pulse density modulation according to one embodiment of the present invention may have a structure similar to or identical to the structure of the signal modulator 100 described with reference to FIG. 1. That is, the method of modulating a signal based on pulse density modulation may be performed based on a program command executed by the processor 110 of the signal modulator 100 described with reference to FIG. 1.

Specifically, the signal modulator shown in FIG. 4 may include a pulse density modulator 410, a correlative encoder 420, an E/O converter 430, an O/E converter 440, and an RF unit 450. Here, the RF unit 450 may include a BPF 451, a frequency converter 452, a local oscillator 453, and a power amplifier 454. The method of modulating a signal based on pulse density modulation according to one embodiment of the present invention may be performed based on a plurality of configurations shown in FIG. 4 and will be described in detail below with reference to FIG. 5.

Referring to FIG. 5, the signal modulator may perform pulse density modulation on an analog signal through the pulse density modulator 410 of the signal modulator (S510). Further, the pulse density modulator 410 of the signal modulator may perform the pulse density modulation on the analog signal based on a sampling frequency which is greater than a frequency bandwidth transmittable in the signal modulator. Accordingly, the signal modulator may shift quantization noise included in the analog signal to a relatively high-frequency band. Here, the quantization noise, which is varied as the pulse density modulation is performed on the analog signal to shift a sampling frequency of the analog signal to a sampling frequency that is greater than a frequency bandwidth transmittable in the signal modulator, will be described with reference to the following Equation 1.

$$q_{rms}^2 = \frac{\pi^{2L} e_{rms}^2}{(2L+1)\left(\frac{f_S}{2f_B}\right)^{2L+1}}$$ [Equation 1]

Equation 1 may represent the power of the quantization noise. In Equation 1, a noise transfer function (NTF) may be set as $(1-z^{-1})^L$. Further, in Equation 1, L may mean an order of the NTF used in the pulse density modulator 410. Furthermore, in Equation 1, $e_{rms}^2$ may denote the power of the quantization noise of the signal output from the pulse density modulator 410. Moreover, in Equation 1, $f_S$ may denote the sampling frequency, and $f_B$ may denote the bandwidth of the signal output from the pulse density modulator 410.

Referring to Equation 1, it can be seen that the power of the quantization noise according to the bandwidth of the pulse density modulated signal decreases as the sampling frequency increases. That is, the decrease in the power of the quantization noise of the pulse density modulated signal in the signal modulator may mean that signal quality is improved. Further, according to Equation 1, when the power of the quantization noise of the pulse density modulated signal is constant, it can be seen that the bandwidth of the pulse density modulated signal increases as the sampling frequency increases.

Meanwhile, the pulse density modulator 410 of the signal modulator may perform signal modulation based on delta-sigma modulation. The pulse density modulated signal of the pulse density modulator 410 in the signal modulator may be a digital signal including information on a plurality of bits.

Then, the signal modulator may convert the bandwidth of the pulse density modulated signal into a bandwidth required for the signal modulator through the correlative encoder 420 of the signal modulator (S520). Specifically, the signal modulator may decrease the bandwidth of the pulse density modulated signal to a bandwidth transmittable in the E/O converter 430 and the O/E converter 440. Alternatively, the correlative encoder 420 of the signal modulator may convert the bandwidth of the pulse density modulated signal into the bandwidth required for the signal modulator based on a delay and add method. Alternatively, the correlative encoder 420 of the signal modulator may convert the bandwidth of the pulse density modulated signal into the bandwidth required for the signal modulator on the basis of an input symbol being input to the correlative encoder 420 and on the basis of a predetermined number of symbols among input symbols which are input to the correlation encoder 420 prior to the input symbol. A plurality of examples for a method of converting a bandwidth through a correlative encoder in a signal modulator may be described in detail below with reference to FIGS. 6A to 6C.

Figure 6A:
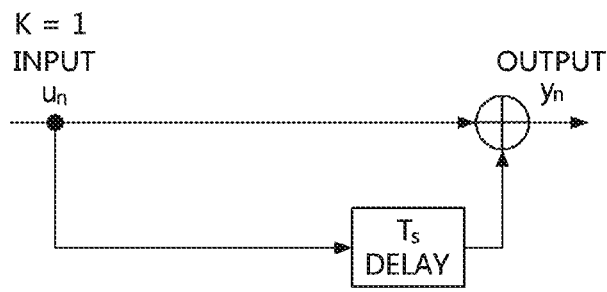
FIGS. 6A to 6C are conceptual diagrams illustrating correlative encoders for the method for signals according to one embodiment of the present invention.
Figure 6B:
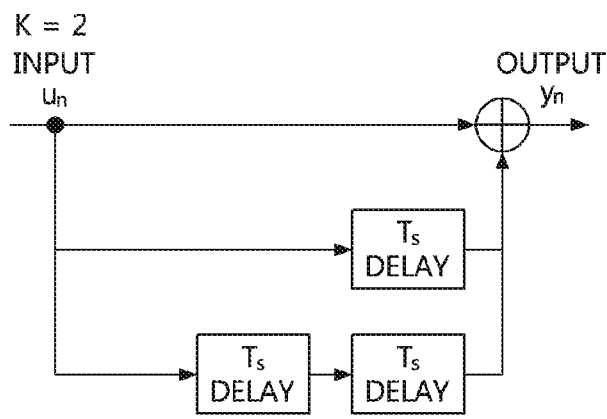
Figure 6C:
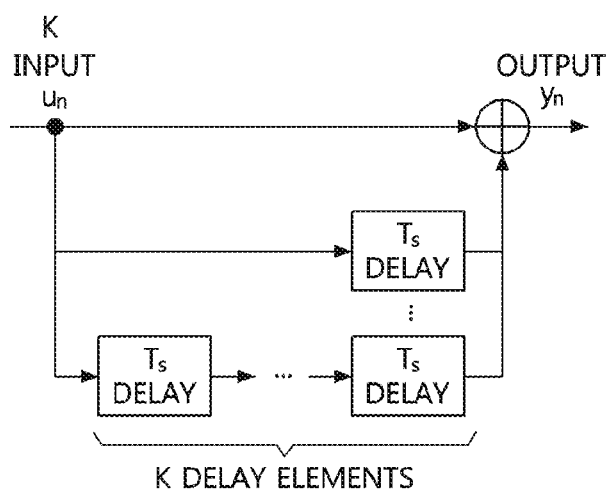

FIGS. 6A to 6C are conceptual diagrams illustrating a correlative encoder according to one embodiment of the present invention.

Referring to FIGS. 6A to 6C, a correlative encoder of a signal modulator for performing the method of modulating a signal according to one embodiment of the present invention may encode a signal on the basis of an input symbol being input to the correlative encoder and previously input k symbols among input symbols which are input to the correlation encoder prior to the input symbol. For example, an operation of the correlative encoder of the signal modulator according to one embodiment of the present invention will be described by exemplifying an operation of a duo-binary encoder. The operation of the duo-binary encoder (e.g., when k is 1) may be expressed by the following Equation 2.

$$y_n = u_n + u_{n-1} = \begin{cases} 2 & \text{for } u_n = u_{n-1} = 1 \\ 0 & \text{for } u_n \neq u_{n-1} \\ -2 & \text{for } u_n = u_{n-1} = -1 \end{cases} \quad [\text{Equation 2}]$$

In Equation 2, $u_n$ may denote an input symbol, and $y_n$ may denote an $n^{th}$ input symbol. In FIGS. 6A to 6C, the duo-binary encoder may be represented, as shown in FIG. 6A, illustrating a case in which k is 1. In this case, $T_S$ of the duo-binary encoder may mean a sampling period of a symbol for a signal input to the duo-binary encoder. Further, in FIGS. 6A to 6C, cases in which a predetermined number k is 2 and in which a predetermined number k is k may be expressed as shown in FIG. 6B and FIG. 6C, respectively. Meanwhile, in the correlative encoder of the signal modulator, a waveform of a signal output from the correlative encoder may be varied according to the predetermined number k. Specifically, the waveform of the signal output from the correlative encoder may be described below with reference to FIGS. 7A to 7C.

Figure 7A:
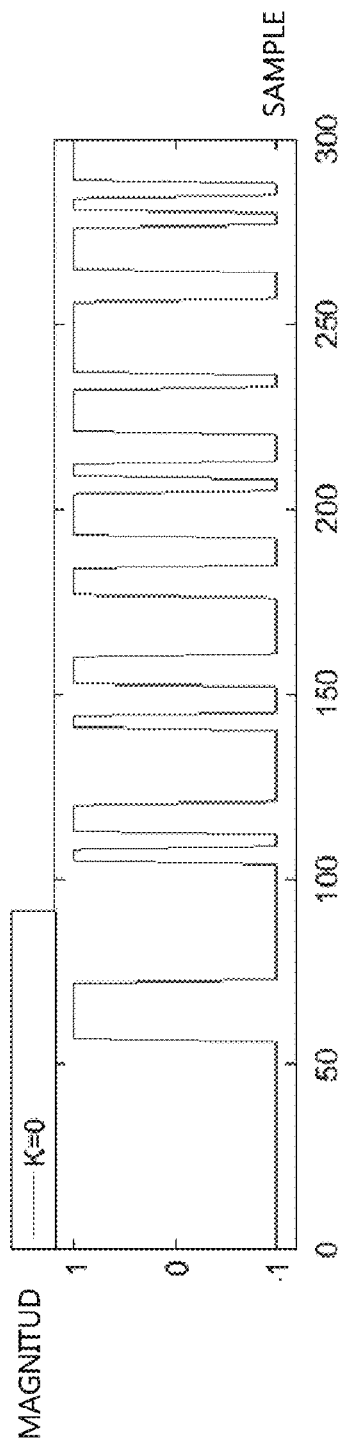
FIGS. 7A to 7C are graphs showing a sample and a magnitude of the correlative encoder according to one embodiment of the present invention.
Figure 7B:
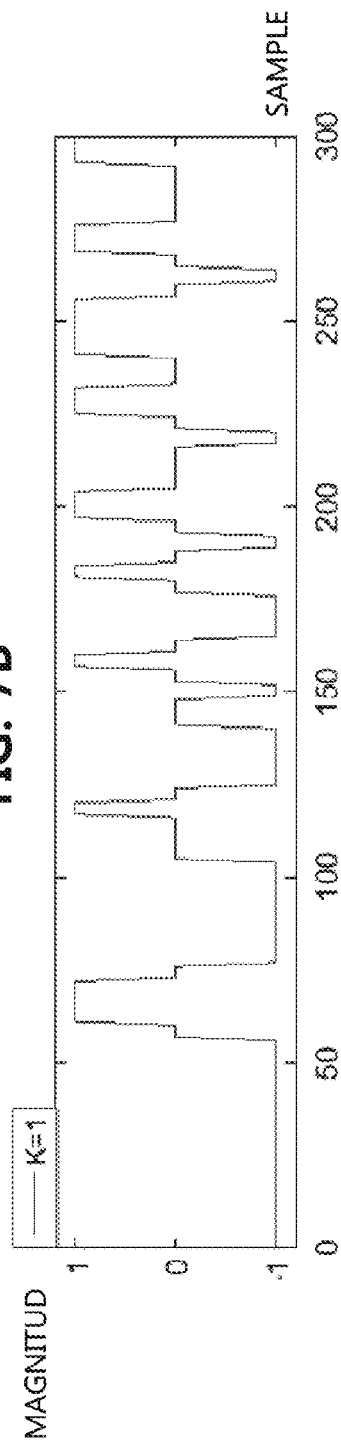
Figure 7C:
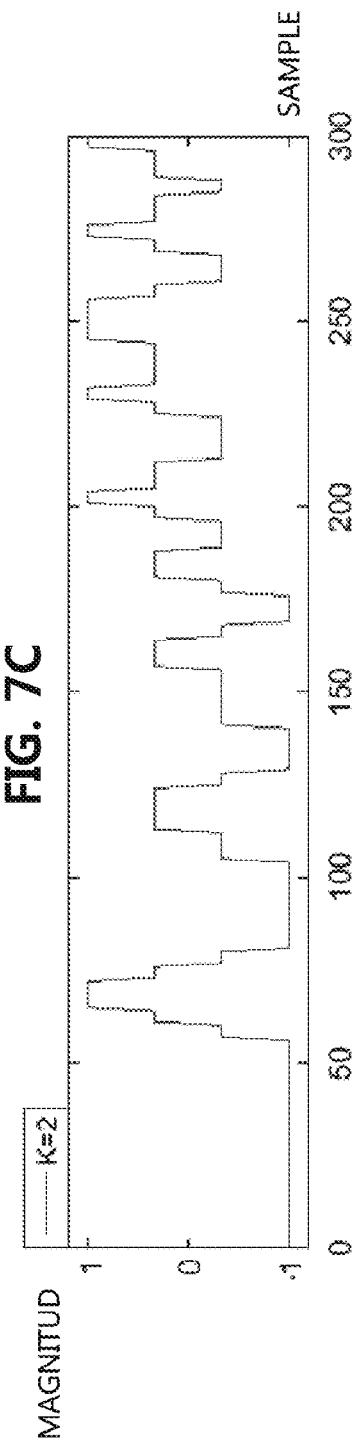
Figure 8:
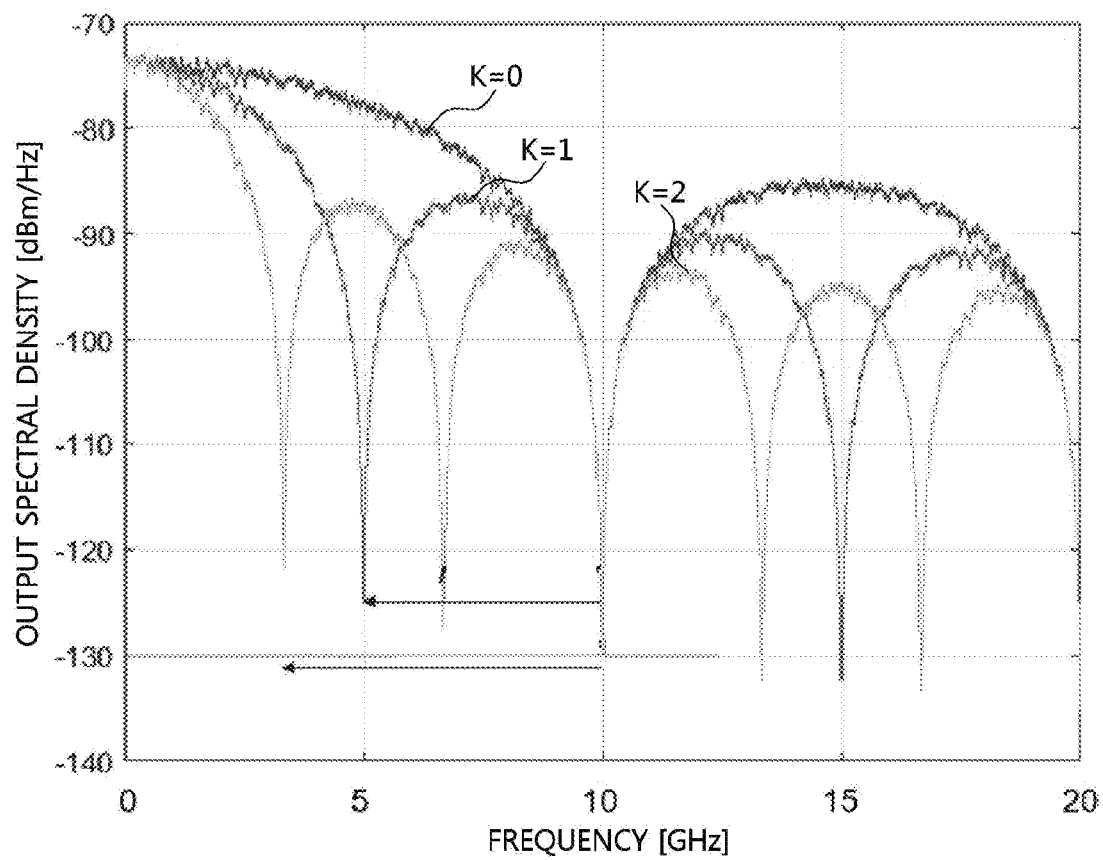
FIG. 8 is a graph showing a frequency and an output spectral density of the correlative encoder according to one embodiment of the present invention.

FIGS. 7A to 7C are graphs showing a sample and a magnitude of the correlative encoder according to one embodiment of the present invention, and FIG. 8 is a graph showing a frequency and an output spectral density of the correlative encoder according to one embodiment of the present invention.

Referring to FIGS. 7A to 7C, first, a y-axis may mean a sample of the correlative encoder, and an x-axis may mean an amplitude. According to FIGS. 7A to 7C, the waveform of the signal output from the correlative encoder of the signal modulator according to one embodiment of the present invention may be varied according to the predetermined number k described with reference to FIG. 6. Specifically, according to FIGS. 7A to 7C, in the cases of the predetermined number k being 0, 1, and 2, the waveform of the signal output from the correlative encoder of the signal modulator may become narrower as the predetermined number k increases.

Further, referring to FIG. 8, an x-axis may mean a frequency and a y-axis may mean an output spectral density. Referring to the frequency and output spectral density of the correlative encoder shown in FIG. 8, it can be seen that the bandwidth of the signal output from the correlative encoder of the signal modulator becomes narrower as the predetermined number k increases. That is, in the cases of the predetermined number k being 0, 1, and 2, the bandwidth of the signal output from the correlative encoder of the signal modulator may become narrower as the predetermined number k increases. Meanwhile, the correlative encoder of the signal modulator according to one embodiment of the present invention may be configured based on an analog filter and will be described in detail below with reference to FIG. 9.

Figure 9:
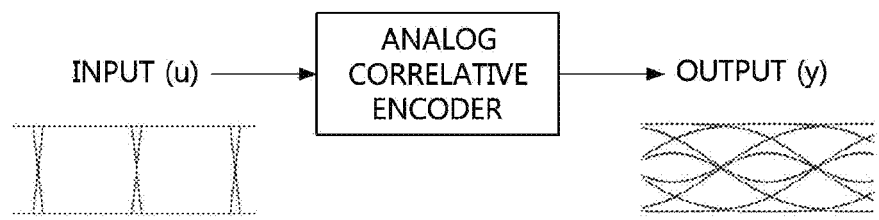
FIG. 9 is a conceptual diagram illustrating the correlative encoder according to one embodiment of the present invention.
Figure 11A:
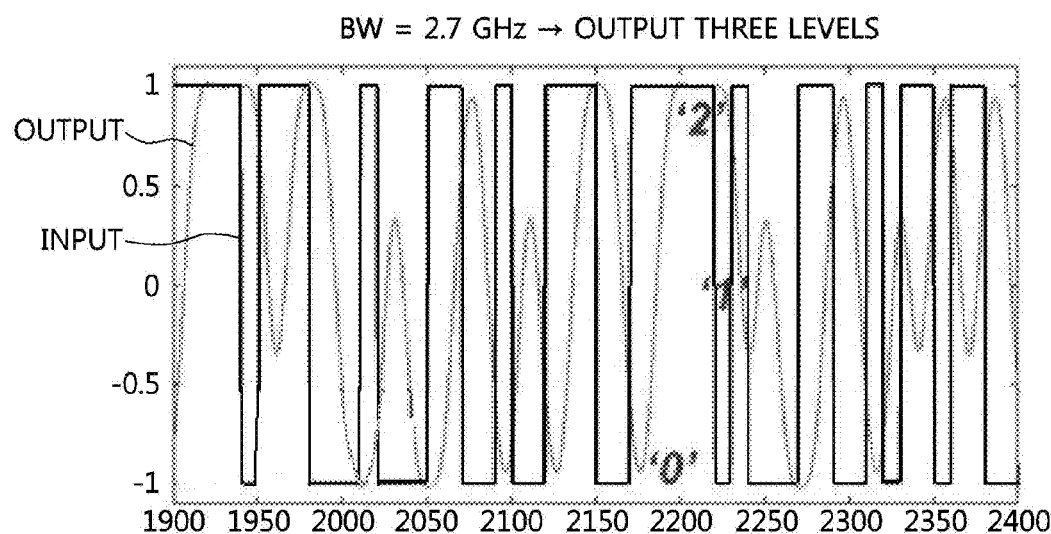
FIGS. 11A and 11B are graphs showing a first example of an input signal and an output signal for the filter of the correlative encoder according to one embodiment of the present invention.
Figure 11B:
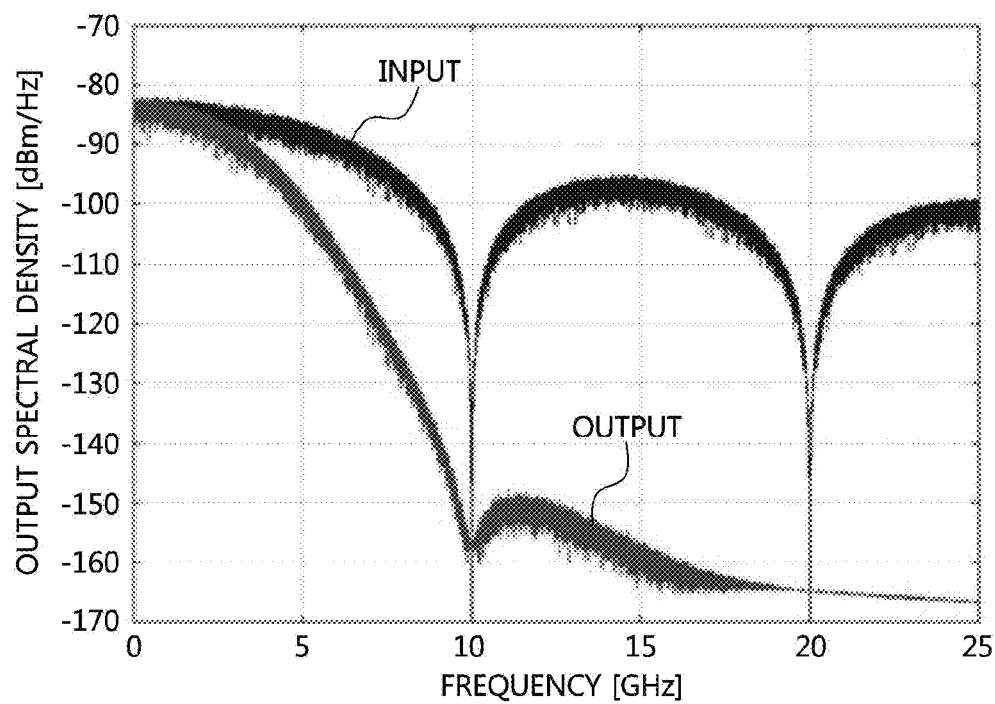
Figure 12A:
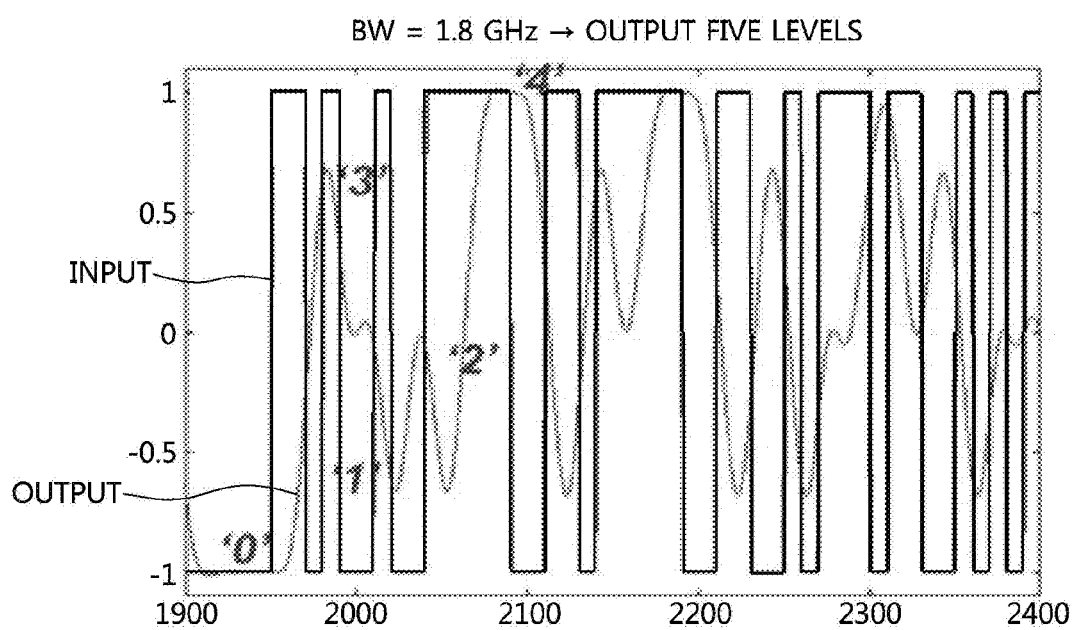
FIGS. 12A and 12B are graphs showing a second example of the input signal and the output signal for the filter of the correlative encoder according to one embodiment of the present invention.
Figure 12B:
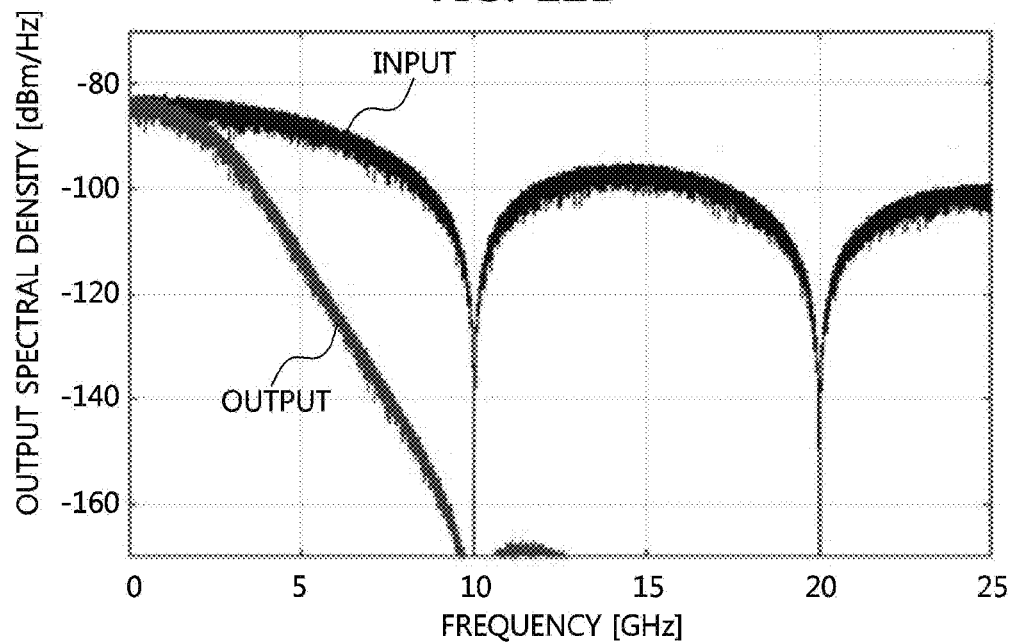

FIG. 9 is a conceptual diagram illustrating the correlative encoder according to one embodiment of the present invention, FIGS. 10A to 10F are graphs showing an output signal through a filter of the correlative encoder according to one embodiment of the present invention, FIGS. 11A and 11B are graphs showing a first example of an input signal and an output signal for the filter of the correlative encoder according to one embodiment of the present invention, and FIGS. 12A and 12B are graphs showing a second example of the input signal and the output signal for the filter of the correlative encoder according to one embodiment of the present invention.

Referring to FIG. 9 first, the correlative encoder of the signal modulator according to one embodiment of the present invention may be an analog correlative encoder. Specifically, the correlative encoder according to one embodiment of the present invention may be a low pass filter. The correlative encoder according to one embodiment of the present invention may be configured with an analog correlative encoder which is constituted with a low pass filter, and an output y of the analog correlative encoder according to an input u may be represented as a waveform of a signal shown in FIG. 9.

Referring to FIG. 10, outputs of the analog correlative encoder according to inputs shown in FIG. 9 can be confirmed. Specifically, according to FIGS. 10A to 10F, an input signal being input to the analog correlative encoder may be a 2-level signal of 10 Gbps. When a bandwidth of a Bessel low pass filter is varied from 6.5 GHz to 1.8 GHz, an eye diagram for an output signal of the Bessel low pass filter can be confirmed.

First, FIG. 10A may show a case in which the bandwidth of the Bessel low pass filter is 6.5 GHz, and FIG. 10B may show a case in which the bandwidth of the Bessel low pass filter is 5.5 GHz. Further, FIG. 10C may show a case in which the bandwidth of the Bessel low pass filter is 4.5 GHz, and FIG. 10D may show a case in which the bandwidth of the Bessel low pass filter is 3.5 GHz. Further, FIG. 10E may show a case in which the bandwidth of the Bessel low pass filter is 2.5 GHz, and FIG. 10F may show a case in which the bandwidth of the Bessel low pass filter is 1.8 GHz. As described above, according to the plurality of eye diagrams shown in FIGS. 10A to 10F, it can be seen that a level of the signal is increased as the bandwidth of the Bessel low pass filter is decreased.

In this regard, referring to FIGS. 11A and 11B and FIGS. 12A and 12B, waveforms and spectra of signals for cases in which bandwidths of the Bessel low pass filter are 2.7 GHz and 1.8 GHz can be confirmed. First, FIGS. 11A and 11B show a case in which the bandwidth of the Bessel low pass filter is 2.7 GHz, and it can be confirmed that a signal having three levels is output. Specifically, FIG. 11A may show waveforms of an input signal and an output signal when the bandwidth of the Bessel low pass filter is 2.7 GHz. FIG. 11B may show spectra of the input signal and the output signal when the bandwidth of the Bessel low pass filter is 2.7 GHz.

Further, FIGS. 12A and 12B show a case in which the bandwidth of the Bessel low pass filter is 1.8 GHz, and it can be confirmed that a signal having five levels is output. Specifically, FIG. 12A may show waveforms of an input signal and an output signal when the bandwidth of the Bessel low pass filter is 1.8 GHz. FIG. 12B may show spectra of the input signal and the output signal when the bandwidth of the Bessel low pass filter is 1.8 GHz.

Referring to FIG. 5 again, the signal modulator for modulating a signal based on pulse density modulation according to one embodiment of the present invention may transmit the bandwidth converted signal to the RF unit 450 of the signal modulator based on the E/O converter 430 and the O/E converter 440 of the signal modulator (S530). Specifically, the correlative encoder 420 of the signal modulator may output the bandwidth converted signal to the E/O converter 430. Then, the E/O converter 430 may output the signal, which is output from the correlative encoder 420, to the O/E converter 440. Thereafter, the O/E converter 440 may output the signal, which is output from the E/O converter 430, to the RF unit 450. With the above-described method, the signal modulator may transmit the bandwidth converted signal to the RF unit 450 based on the E/O converter 430 and the O/E converter 440.

Then, the signal modulator may output a frequency band filtered signal, of which the bandwidth is converted, via the RF unit 450 (S540). A detailed method of outputting a filtered signal via an RF unit in the signal modulator will be described below with reference to FIG. 13.

Figure 13:
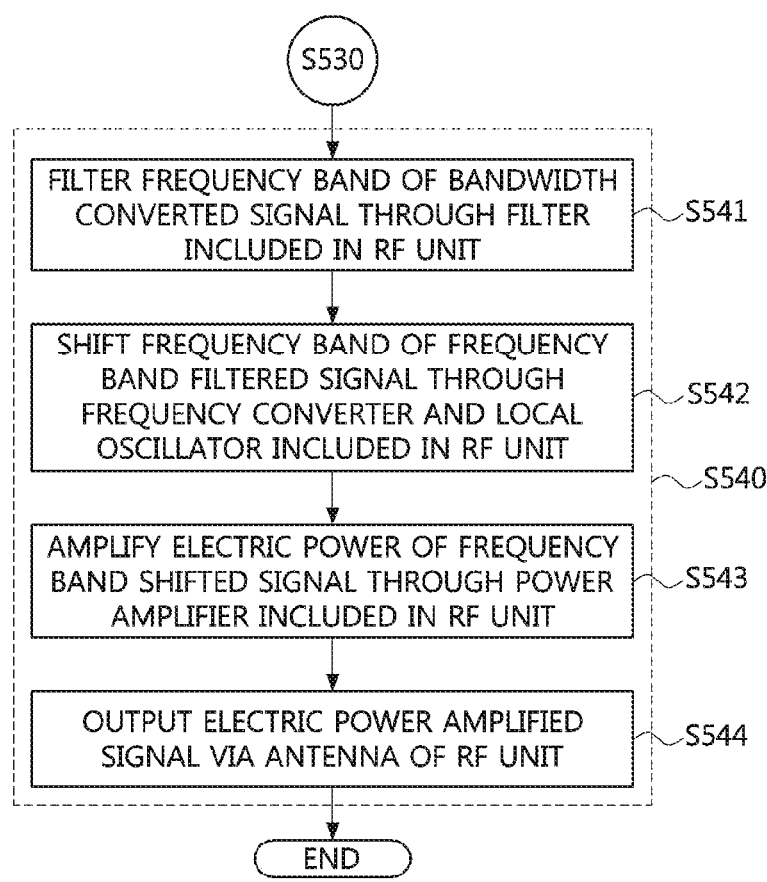
FIG. 13 is a flowchart illustrating a method of outputting a frequency band filtered signal in the method of modulating a signal according to one embodiment of the present invention.

FIG. 13 is a flowchart illustrating a method of outputting a frequency band filtered signal in the method of modulating a signal according to one embodiment of the present invention.

Referring to FIG. 13, the signal modulator according to one embodiment of the present invention may filter a frequency band of the bandwidth converted signal through the BPF 451 included in the RF unit 450 (S541). Specifically, the signal modulator may perform filtering on a frequency band required for the signal modulator among frequency bands of the bandwidth converted signal through the BPF 451 included in the RF unit 450.

Then, the signal modulator may shift a frequency band of the frequency band filtered signal through the frequency converter 452 and the local oscillator 453 included in the RF unit 450 (S542). Specifically, the signal modulator may shift a frequency band of the frequency band filtered signal to a frequency band, which is required to be output, through the frequency converter 452 and the local oscillator 453 included in the RF unit 450.

Thereafter, the signal modulator may amplify electric power of the frequency band shifted signal through the power amplifier 454 included in the RF unit 450 (S543). Then, the signal modulator may output the electric power amplified signal via the antenna of the RF unit 450 (S544). That is, the signal modulator may amplify the electric power of the signal through the power amplifier 454 included in the RF unit 450 and output the electric power amplified signal via the antenna included in the RF unit 450.

As described above, the method of modulating a signal based on pulse density modulation according to one embodiment of the present invention may be performed in the signal modulator as described with reference to FIGS. 4 to 13. Meanwhile, the method of modulating a signal based on pulse density modulation according to one embodiment of the present invention has been described for the case in which a pulse density modulator is used, and hereinafter, the method will be described for a case in which a plurality of pulse density modulators are used with reference to FIG. 14 to FIGS. 19A to 19H.

Figure 14:
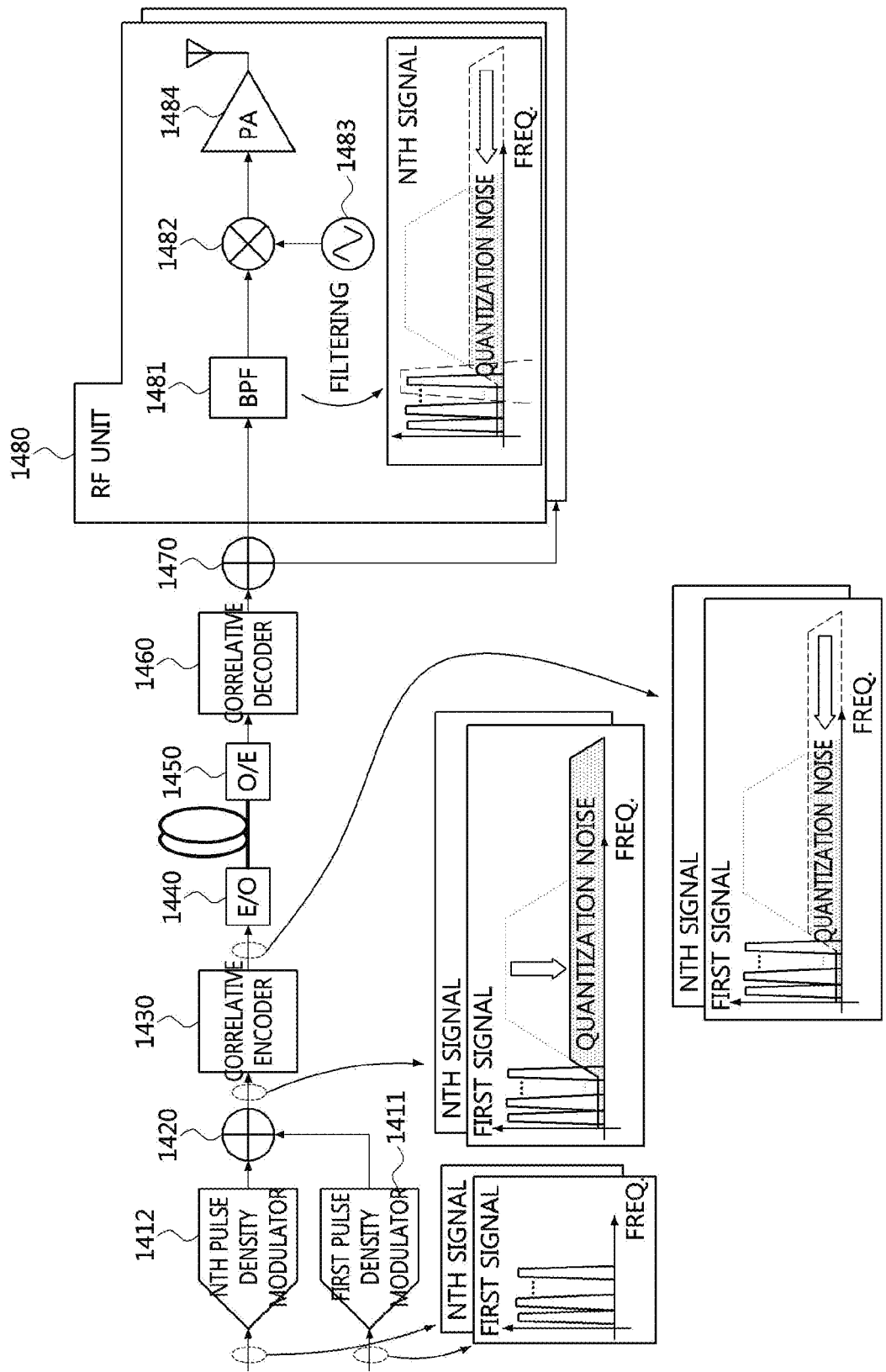
FIG. 14 is a conceptual diagram illustrating a method of modulating a signal based on pulse density modulation according to another embodiment of the present invention.
Figure 15:
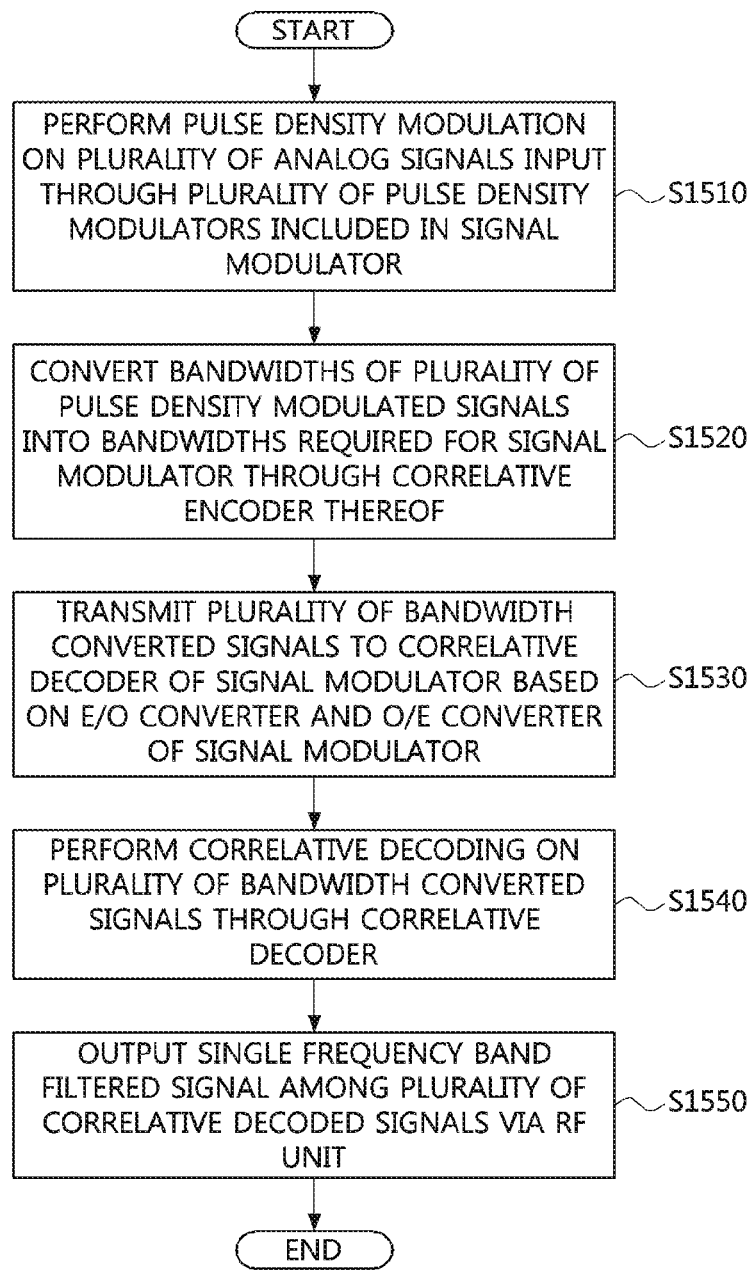
FIG. 15 is a flowchart illustrating the method of modulating a signal based on pulse density modulation according to another embodiment of the present invention.

FIG. 14 is a conceptual diagram illustrating a method of modulating a signal based on pulse density modulation according to another embodiment of the present invention, and FIG. 15 is a flowchart illustrating the method of modulating a signal based on pulse density modulation according to another embodiment of the present invention.

Referring to FIG. 14, a signal modulator for performing the method of modulating a signal based on pulse density modulation according to another embodiment of the present invention may have a structure similar to or identical to the structure of the signal modulator 100 described with reference to FIG. 1. That is, the method of modulating a signal based on pulse density modulation may be performed based on a program command executed by the processor 110 of the signal modulator 100 described with reference to FIG. 1.

Specifically, the signal modulator of FIG. 14 may include a first pulse density modulator 1411, an $N^{th}$ pulse density modulator 1412, a multiplexer 1420, a correlative encoder 1430, an E/O converter 1440, an O/E converter 1450, a correlative decoder 1460, a demultiplexer 1470, and an RF unit 1480. Here, the RF unit 1480 may include a BPS 1481, a frequency converter 1482, a local oscillator 1483, and a power amplifier 1484. The method of modulating a signal based on pulse density modulation according to one embodiment of the present invention may be performed based on a plurality of configurations shown in FIG. 14 and will be described in detail below with reference to FIG. 15.

Referring to FIG. 15, the signal modulator may perform pulse density modulation on a plurality of analog signals input thereto through a plurality of pulse density modulators included in the signal modulator (S1510). Here, the plurality of pulse density modulators included in the signal modulator may mean the first pulse density modulators 1411 and the $N^{th}$ pulse density modulator 1412 which are described with reference to FIG. 14.

Specifically, the plurality of pulse density modulators may perform the pulse density modulation on the plurality of analog signals based on a sampling frequency which is greater than a frequency bandwidth transmittable in the signal modulator. Accordingly, the signal modulator may shift quantization noise included in each of the plurality of analog signals to a relatively high-frequency band. Further, each of the plurality of pulse density modulators may perform pulse density modulation based on delta-sigma modulation method. The pulse density modulated signals through the plurality of pulse density modulators in the signal modulator may be digital signals including information on a plurality of bits.

Then, the signal modulator may convert bandwidths of the pulse density modulated signals into bandwidths required for the signal modulator through the correlative encoder 1420 of the signal modulator (S1520). The method of converting the bandwidths in the signal modulator will be described in detail below with reference to FIG. 16.

Figure 16:
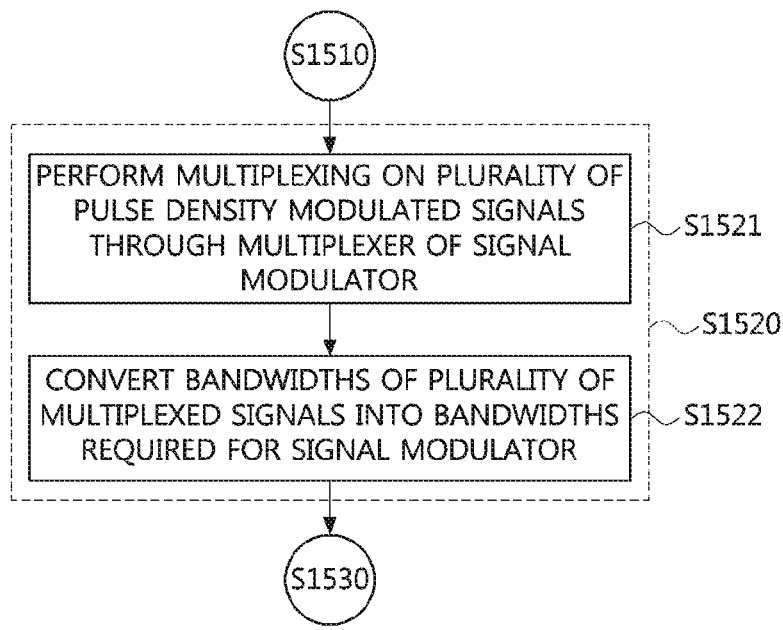
FIG. 16 is a flowchart illustrating a method of converting a bandwidth in the method of modulating a signal according to another embodiment of the present invention.

FIG. 16 is a flowchart illustrating a method of converting a bandwidth in the method of modulating a signal according to another embodiment of the present invention;

Referring to FIG. 16, a signal modulator according to another embodiment of the present invention may perform multiplexing on the plurality of pulse density modulated signals through the multiplexer 1420 of the signal modulator (S1521). That is, according to FIG. 14, the signal modulator may multiplex the pulse density modulated signal from the first pulse density modulator 1411 and the pulse density modulated signal from the $N^{th}$ pulse density modulator 1412 through the multiplexer 1420.

Then, the signal modulator may convert bandwidths of the plurality of multiplexed signals into bandwidths required for the signal modulator (S1522). Specifically, a method of converting the bandwidth in the signal modulator may be similar to the method described with reference to operation S520 of FIG. 5. That is, the signal modulator may reduce the bandwidths of the plurality of signals, on which multiplexing is performed, to bandwidths transmittable in the E/O converter 1440 and the O/E converter 1450. Alternatively, the correlative encoder 1430 of the signal modulator may convert the bandwidths of the plurality of signals, on which the multiplexing is performed, into the bandwidths required for the signal modulator based on a delay and add method. Alternatively, the correlative encoder 1430 of the signal modulator may convert the bandwidths of the plurality of signals, on which the multiplexing is performed, into the bandwidths required for the signal modulator on the basis of an input symbol being input to the correlative encoder 1430 and a predetermined number of symbols among input symbols which are input to the correlative encoder 1430 prior to the input symbol.

Referring to FIG. 15 again, the signal modulator may transmit the plurality of bandwidth converted signals to the correlative decoder 1460 of the signal modulator based on the E/O converter 1440 and the O/E converter 1450 of the signal modulator (S1530). Specifically, the correlative encoder 1430 of the signal modulator may output the plurality of bandwidth converted signals to the E/O converter 1440. Then, the E/O converter 1440 may output the signals, which are output from the correlative encoder 1430, to the O/E converter 1450. Thereafter, the O/E converter 1450 may output the signals, which are output from the E/O converter 1440, to the correlative decoder 1460. With the above-described method, the signal modulator may transmit the plurality of bandwidth converted signals to the correlative decoder 1460 based on the E/O converter 1440 and the O/E converter 1450.

Then, the signal modulator may perform correlative decoding on the plurality of bandwidth converted signals through the correlative decoder 1460 (S1540). That is, according to FIG. 14, the signal modulator may perform the correlative decoding on the plurality of bandwidth converted signals, which are signals output from the O/E converter 1450, through the correlative decoder 1460.

Then, the signal modulator may output a single frequency band filtered signal from among the plurality of correlative decoded signals via the RF unit 1480 (S1550). Specifically, the correlative decoder 1460 of the signal modulator may perform the correlative decoding on the plurality of bandwidth converted signals and may output the plurality of correlative decoded signals to the RF unit 1480 of the signal modulator. Thereafter, the RF unit 1480 of the signal modulator may filter the frequency bands of the plurality of signals, on which the correlative decoding is performed, the output from the correlative decoder 1460. A detailed method of filtering the frequency bands of the plurality of signals in the signal modulator will be described below with reference to FIGS. 17 and 18.

Figure 17:
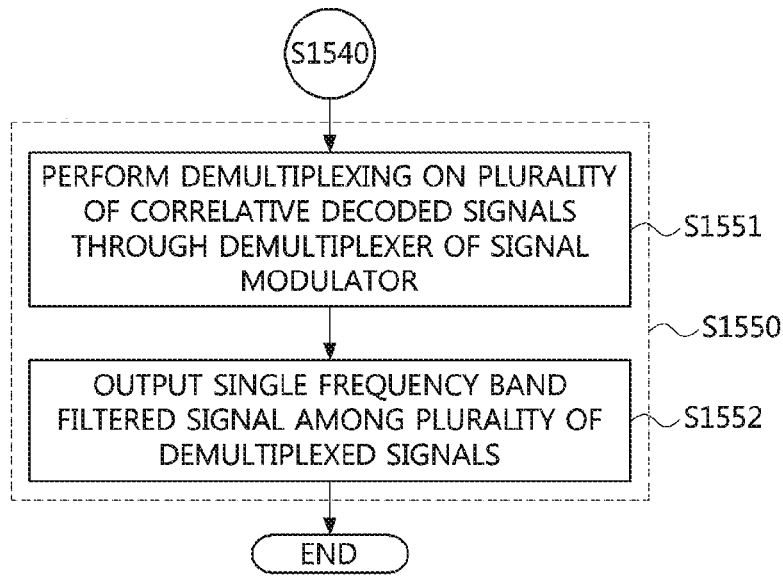
FIG. 17 is a flowchart illustrating a method of outputting a frequency band filtered signal in the method of modulating a signal according to another embodiment of the present invention.
Figure 18:
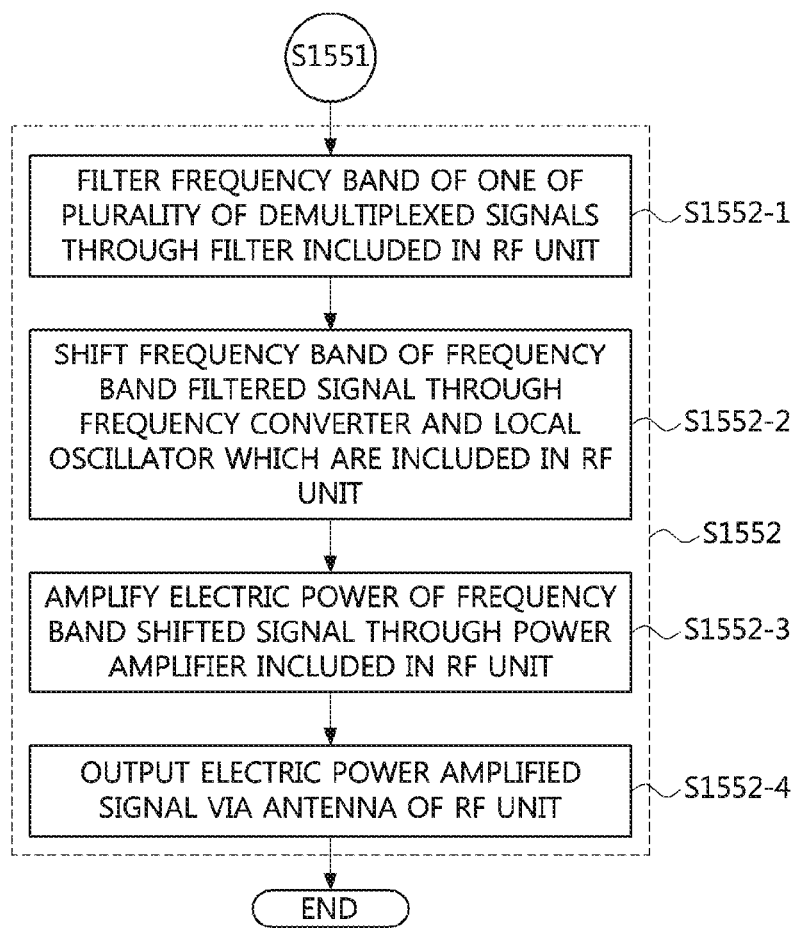
FIG. 18 is a flowchart illustrating a method of transmitting an electric power amplified signal via an antenna of a radio frequency (RF) unit in the method of modulating a signal according to another embodiment of the present invention.

FIG. 17 is a flowchart illustrating a method of outputting a frequency band filtered signal in the method of modulating a signal according to another embodiment of the present invention, and FIG. 18 is a flowchart illustrating a method of transmitting an electric power amplified signal via an antenna of an RF unit in the method of modulating a signal according to another embodiment of the present invention.

Referring to FIG. 17, the signal modulator for performing the method of modulating a signal according to another embodiment of the present invention may perform demultiplexing on the plurality of correlative decoded signals through the demultiplexer 1470 of the signal modulator (S1551). That is, according to FIG. 14, the signal modulator may demultiplex the plurality of signals, on which the correlative decoding is performed and which are output from the correlative decoder 1460, through the demultiplexer 1470. Then, the demultiplexer 1470 of the signal modulator may output a plurality of demultiplexed signals to the RF unit 1480.

Thereafter, the signal modulator may output a single frequency band filtered signal from among the plurality of demultiplexed signals (S1552). That is, the signal modulator may filter a frequency band of a single signal from among the plurality of demultiplexed signals and output the frequency band filtered signal through the RF unit 1480. A detailed method of outputting the frequency band filtered signal in the signal modulator will be described in detail below with reference to FIG. 18.

Referring to FIG. 18, the signal modulator may filter a frequency band of one of the plurality of demultiplexed signals through the BPF 1481 included in the RF unit 1480 (S1552-1). Specifically, the signal modulator may perform filtering on a frequency band, which is required for the signal modulator, from among frequency bands of the plurality of demultiplexed signals through the BPF 1481 included in the RF unit 1480.

Then, the signal modulator may shift a frequency band of the frequency band filtered signal through the frequency converter 1482 and the local oscillator 1483 which are included in the RF unit 1480 (S1552-2). Specifically, the signal modulator may shift a frequency band of the frequency band filtered signal to a frequency band which is required to be output through the frequency converter 1482 and the local oscillator 1483 included in the RF unit 1480.

Thereafter, the signal modulator may amplify electric power of the frequency band shifted signal through the power amplifier 1484 included in the RF unit 1480 (S1552-3). Then, the signal modulator may output the electric power amplified signal via an antenna of the RF unit 1480 (S1552-4). That is, the signal modulator may amplify the electric power of the signal through the power amplifier 1484 included in the RF unit 1480 and output the electric power amplified signal via the antenna included in the RF unit 1480.

As described above, the method for signal modulation based on pulse density modulation according to another embodiment of the present invention may be performed in the signal modulator as described with reference to FIGS. 14 to 18. Meanwhile, a waveform of the signal according to the method for signal modulation according to another embodiment of the present invention, which is described with reference to FIGS. 14 to 18, will be described in detail below with reference to FIGS. 19A to 19H.

FIGS. 19A to 19H are graphs showing a signal of the method for signal modulation according to another embodiment of the present invention.

Referring to FIGS. 19A to 19H, eye diagrams for waveforms of a plurality of signals appearing in a process of performing the method for signal modulation to another embodiment of the present invention can be confirmed. Specifically, an x-axis of each of a plurality of graphs shown in FIGS. 19A to 19H may represent a time of a signal, and a y-axis thereof may represent a magnitude of the signal.

First, among the plurality of eye diagrams shown in FIGS. 19A to 19H, FIGS. 19A and 19B may show eye diagrams for a case in which signals output from the pulse density modulators are 2-level signals of 10 Gbps. For example, FIG. 19A may show an eye diagram for a pulse density modulated signal from the first pulse density modulator 1411 shown in FIG. 14. Further, FIG. 19B may show the eye diagram for a pulse-density-modulated signal from the $N^{th}$ pulse density modulator 1412 shown in FIG. 14.

Furthermore, among the plurality of eye diagrams shown in FIGS. 19A to 19H, FIG. 19C may show an eye diagram for a case in which each of the plurality of signals multiplexed by a multiplexer has a 4-level amplitude. For example, FIG. 19C may show the eye diagram of the case in which each of the plurality of signals multiplexed by the multiplexer 1420 shown in FIG. 14 has a 4-level amplitude.

Figure 19A:
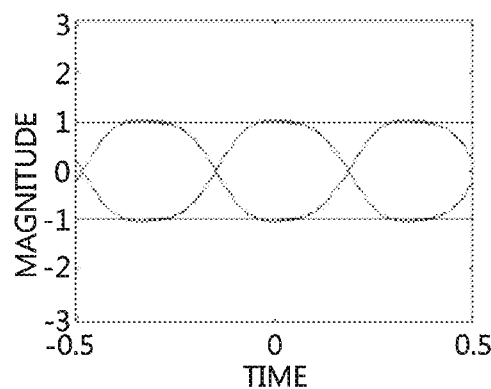
FIGS. 19A to 19H are graphs showing a signal of the method of modulating a signal according to another embodiment of the present invention.
Figure 19B:
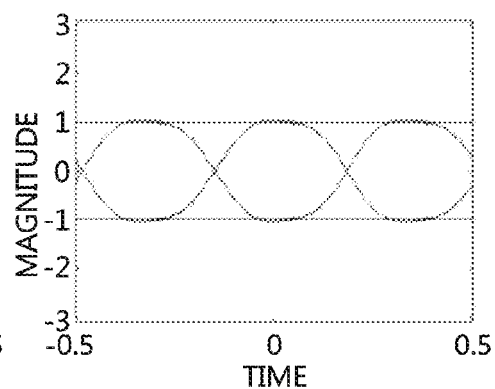
Figure 19C:
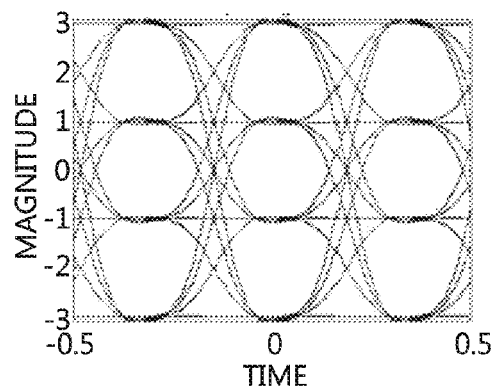
Figure 19D:
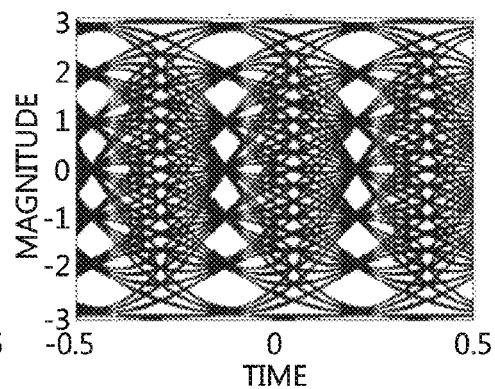
Figure 19E:
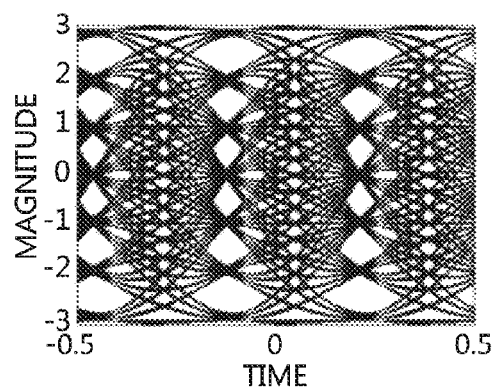

Further, FIG. 19D may show an eye diagram for a plurality of correlative encoded signals based on a Bessel low pass filter having a bandwidth of 2.7 GHz in a correlative encoder. For example, FIG. 19D may show the eye diagram for the plurality of signals output by the correlative encoder 1430 shown in FIG. 14. Further, FIG. 19E may show an eye diagram for a plurality of signals input to the correlative decoder based on an E/O converter and an O/E converter. For example, FIG. 19E may show the eye diagram for the plurality of signals input to the correlative decoder 1460 shown in FIG. 14.

Figure 19F:
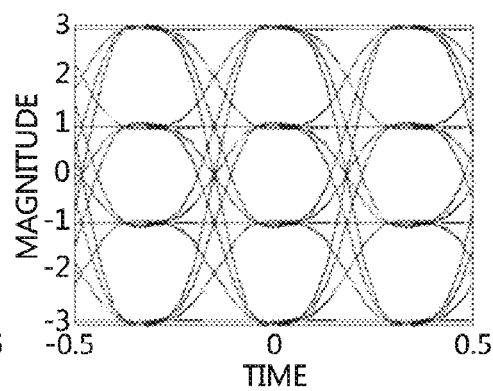

Further, FIG. 19F may show an eye diagram for a plurality of signals which are obtained by performing, by a correlative decoder, correlative decoding on the plurality of signals which undergo correlative encoding by a correlative encoder. For example, FIG. 19F may show the eye diagram for the plurality of signals on which correlative decoding is performed by the correlative decoder 1460 shown in FIG. 14.

Figure 19G:
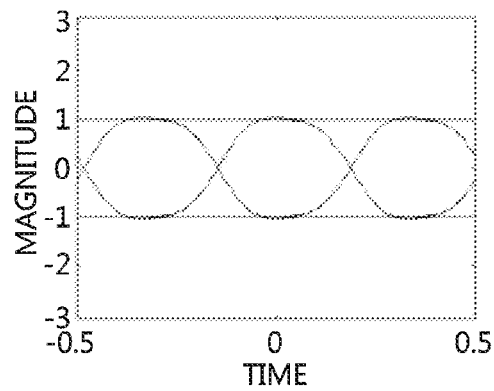
Figure 19H:
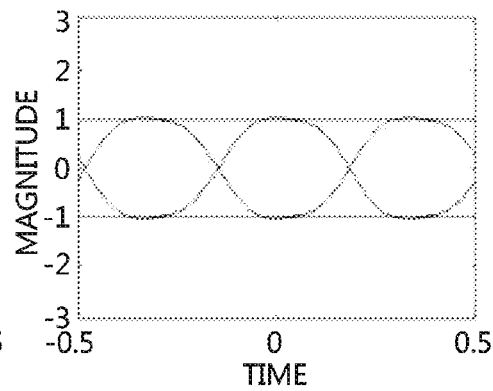

Further, FIGS. 19G and 19H may show eye diagrams for signals output from a demultiplexer. For example, FIG. 19G may show the eye diagram of the signal which is identical to a signal output from the first pulse density modulator 1411 shown in FIG. 14 and which undergoes demultiplexing by the demultiplexer 1470. Further, FIG. 19H may show the eye diagram for the signal which is identical to a signal output from the $N^{th}$ pulse density modulator 1412 shown in FIG. 14 and which undergoes demultiplexing by the demultiplexer 1470.

Figure 20:
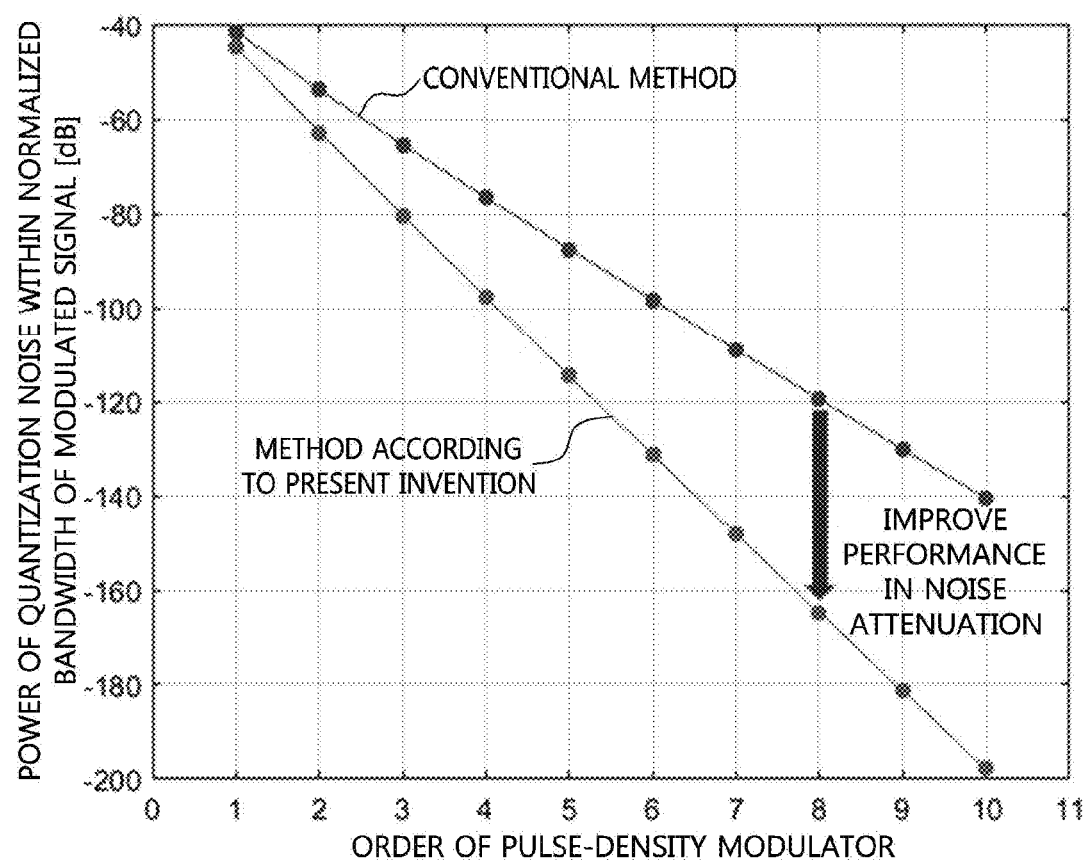
FIG. 20 is a graph showing a first example for the performance of the methods of modulating a signal according to one embodiment and another embodiment of the present invention.
Figure 21:
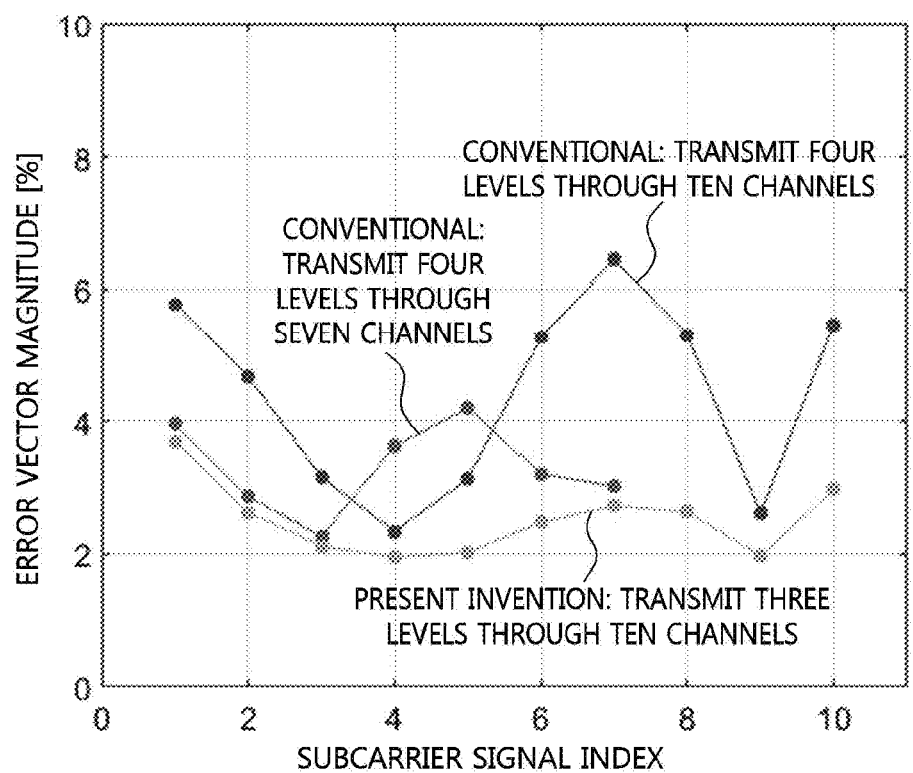
FIG. 21 is a graph showing a second example for the performance of the methods of modulating a signal according to one embodiment and another embodiment of the present invention.

FIG. 20 is a graph showing a first example for the performance of the methods of modulating a signal according to one embodiment and another embodiment of the present invention, and FIG. 21 is a graph showing a second example for the performance of the methods of modulating a signal according to one embodiment and another embodiment of the present invention.

FIG. 20 shows performance of the methods of modulating a signal according to one embodiment and another embodiment of the present invention, and it can be confirmed that the performance relating to attenuation of quantization noise is improved. Specifically, in FIG. 20, an x-axis of the graph may represent an order of the pulse density modulator, and a y-axis thereof may represent the power of quantization noise within a normalized bandwidth of a modulated signal.

In the graph shown in FIG. 20, a result of the conventional method may mean that a signal having a bandwidth of 500 MHz is sampled based on a sampling frequency of 10 GHz through a pulse density modulator, and an output signal has three levels. Further, in the graph shown in FIG. 20, a result of the method according to the present invention may mean a case in which a signal having a bandwidth of 500 MHz is sampled based on a sampling frequency of 20 GHz through a pulse density modulator, and a correlation encoder is applied to reduce, by half, a bandwidth of a 2-level signal being output and increase the number of levels to three.

In this case, it can be confirmed that the result of the method according to the present invention is reduced in power of the quantization noise power as compared to the result of the conventional method. That is, the result of the method according to the present invention may mean that performance in attenuation of the quantization noise is improved as compared with the result of the conventional method.

FIG. 21 shows performance of the methods of modulating a signal according to one embodiment and another embodiment of the present invention, wherein it can be confirmed that a transmission capacity of the signal modulator is improved. Specifically, in the graph of FIG. 21, an x-axis may represent a subcarrier signal index, and a y-axis may represent an error vector magnitude.

In the graph shown in FIG. 21, results of the conventional method may mean cases in which a 4-level signal is transmitted through ten channels and seven channels. In other words, the results of the conventional method may show that signal quality is improved by reducing the number of channels from ten to seven.

On the other hand, in the graph shown in FIG. 21, a result of the method according to the present invention may mean that a 3-level signal is transmitted through ten channels. That is, it can be confirmed that the result according to the method of the present invention exhibits that the number of levels is reduced as compared to the result of the conventional method, and signal quality is improved even though the number of channels is increased.

According to the present invention, in a process of modulating a signal based on pulse density modulation, a pulse density modulator is driven at a sampling frequency that is higher than a transmission frequency band, and a bandwidth of a broadband signal for an output signal of the pulse density modulator is converted into a bandwidth transmittable in a device for modulating a signal such that there is an effect in that performance in reduction of noise within the bandwidth of the modulated signal can be improved.

Further, the method for signal modulation based on pulse density modulation according to the present invention has an effect of improving signal quality by reducing quantization noise within the bandwidth of the modulated signal. Furthermore, the method for signal modulation based on pulse density modulation according to the present invention has an effect of providing a wide transmission capacity by increasing a channel of a subcarrier.

The methods according to the present invention may be implemented in the form of a program command which is executable through various computer means and may be recorded in a computer-readable medium. The computer-readable medium may include program instructions, data files, data structures, and the like alone or as a combination thereof. The program instructions recorded in the computer-readable medium may be specially designed and configured for the present invention or may be available to those skilled in the art of computer software.

Examples of the computer-readable medium include specially configured hardware, such as a ROM, a RAM, a flash memory, and the like, for storing and performing program instructions. Examples of the program instructions include machine language codes generated by a compiler, as well as high-level language codes which are executable by a computer using an interpreter or the like. The above-described hardware may be configured to operate as at least one software module to perform an operation of the present invention, and vice versa.

Although the description has been made with reference to the embodiments of the present invention, it should be understood that various alternations and modifications of the present invention can be devised by those skilled in the art to which the present invention pertains without departing from the spirit and scope of the present invention, which are defined by the appended claims. While the example embodiments of the present invention and their advantages have been described in detail, it should be understood that various changes, substitutions and alterations may be made herein without departing from the scope of the invention.

What is claimed is:

1. A method for signal modulation based on pulse density modulation, which is performed in an apparatus for modulating a signal, the method comprising:
    performing pulse density modulation on an analog signal input to the apparatus through a pulse density modulator of the apparatus;
    converting a bandwidth of the pulse density modulated signal into a bandwidth required for the apparatus through a correlative encoder of the apparatus;
    transmitting the bandwidth converted signal to a radio frequency (RF) unit of the apparatus based on an electrical-to-optical (E/O) converter and an optical-to-electrical (O/E) converter of the apparatus; and
    filtering a frequency band of the bandwidth converted signal and outputting the frequency band filtered signal via the RF unit.

2. The method of claim 1, wherein the performing of the pulse density modulation is performed based on a delta-sigma modulation method in the pulse density modulator.

3. The method of claim 1, wherein the performing of the pulse density modulation is performed on the analog signal based on a sampling frequency that is greater than a frequency bandwidth transmittable in the apparatus.

4. The method of claim 1, wherein the pulse density modulated signal is a digital signal including information on a plurality of bits.

5. The method of claim 1, wherein the converting of the bandwidth of the pulse density modulated signal into the bandwidth required for the apparatus includes reducing the bandwidth of the pulse density modulated signal to a bandwidth transmittable in the E/O converter and the O/E converter.

6. The method of claim 1, wherein the converting of the bandwidth of the pulse density modulated signal into the bandwidth required for the apparatus is performed based on a delay and add method in the correlative encoder.

7. The method of claim 1, wherein the converting of the bandwidth of the pulse density modulated signal into the bandwidth required for the apparatus is performed based on an input symbol, which is input to the correlative encoder, and a predetermined number of symbols among a plurality of symbols which are input prior to the input symbol.

8. The method of claim 1, wherein the outputting of the frequency band filtered signal includes:
    filtering the frequency band of the bandwidth converted signal through a filter included in the RF unit;
    shifting a frequency band of the frequency band filtered signal through a frequency converter and a local oscillator included in the RF unit;
    amplifying electric power of the frequency band shifted signal through a power amplifier included in the RF unit; and
    outputting the electric power amplified signal through an antenna of the RF unit.

9. A method for signal modulation based on pulse density modulation, which is performed in an apparatus for modulating a signal, the method comprising:
    performing pulse density modulation on a plurality of analog signals input to the apparatus through a plurality of pulse density modulators included in the apparatus;
    converting bandwidths of the plurality of pulse density modulated signals into bandwidths required for the apparatus through a correlative encoder of the apparatus;
    transmitting the plurality of bandwidth converted signals to a correlative decoder of the apparatus based on an electrical-to-optical (E/O) converter and an optical-to-electrical (O/E) converter of the apparatus;
    performing correlative decoding on the plurality of bandwidth converted signals through the correlative decoder; and
    filtering a frequency band of one among the plurality of decoded signals and outputting the frequency band filtered signal via a radio frequency (RF) unit.

10. The method of claim 9, wherein the performing of the pulse density modulation is performed based on a delta-sigma modulation method in the plurality of pulse density modulators.

11. The method of claim 9, wherein the performing of the pulse density modulation is performed on the plurality of analog signals based on a sampling frequency that is greater than a frequency bandwidth transmittable in the apparatus.

12. The method of claim 9, wherein the plurality of pulse density modulated signals are digital signals including information on a plurality of bits.

13. The method of claim 9, wherein the converting of the bandwidths of the plurality of pulse density modulated signals into the bandwidths required for the apparatus includes reducing the bandwidths of the plurality of pulse density modulated signals to bandwidths transmittable in the E/O converter and the O/E converter.

14. The method of claim 9, wherein the converting of the bandwidths of the plurality of pulse density modulated signals into the bandwidths required for the apparatus is performed based on a delay and add method in the correlative encoder.

15. The method of claim 9, wherein the converting of the bandwidths of the plurality of pulse density modulated signals into the bandwidths required for the apparatus is performed based on an input symbol, which is input to the correlative encoder, and a predetermined number of symbols among a plurality of symbols which are input prior to the input symbol.

16. The method of claim 9, wherein the converting of the bandwidths of the plurality of pulse density modulated signals into the bandwidths required for the apparatus includes:
    performing multiplexing on the plurality of pulse density modulated signals through a multiplexer of the apparatus; and
    converting the bandwidths of the plurality of multiplexed signals into bandwidths required for the apparatus.

17. The method of claim 9, wherein the outputting of the frequency band filtered signal includes:
    performing demultiplexing on the plurality of decoded signals through a demultiplexer of the apparatus; and
    filtering a frequency band of one among the plurality of demultiplexed signals and outputting the frequency band filtered signal.

18. The method of claim 17, wherein the outputting of the frequency band filtered signal includes:
- filtering the frequency band of one among the plurality of demultiplexed signals through a filter included in the RF unit;
- shifting the frequency band of the frequency band filtered signal through a frequency converter and a local oscillator included in the RF unit;
- amplifying electric power of the frequency band shifted signal through a power amplifier included in the RF unit; and
- outputting the electric power amplified signal through an antenna of the RF unit.

* * * * *